US012325219B2

United States Patent
Landa et al.

(10) Patent No.: US 12,325,219 B2
(45) Date of Patent: Jun. 10, 2025

(54) SYSTEM FOR INTRODUCING A SUBSTRATE INTO A NIP

(71) Applicant: LUMET TECHNOLOGIES LTD., Rehovot (IL)

(72) Inventors: Benzion Landa, Nes Ziona (IL); Jitschak Sanders, Givat Shmuel (IL); Yosef Shachak, Kfar Saba (IL); Ofir Neger, Rishon LeZion (IL)

(73) Assignee: Lumet Technologies LTD, Rehovot (IL)

( * ) Notice: Subject to any disclaimer, the term of this patent is extended or adjusted under 35 U.S.C. 154(b) by 84 days.

(21) Appl. No.: 18/284,530

(22) PCT Filed: Apr. 5, 2022

(86) PCT No.: PCT/IB2022/053159
§ 371 (c)(1),
(2) Date: Sep. 27, 2023

(87) PCT Pub. No.: WO2022/214959
PCT Pub. Date: Oct. 13, 2022

(65) Prior Publication Data
US 2024/0173954 A1    May 30, 2024

(30) Foreign Application Priority Data

Apr. 7, 2021    (GB) ..................................... 2104962

(51) Int. Cl.
*B32B 37/00*    (2006.01)
*B65G 15/30*    (2006.01)
(Continued)

(52) U.S. Cl.
CPC ............ *B32B 37/025* (2013.01); *B65G 15/30* (2013.01); *H05K 3/207* (2013.01); *H10F 71/00* (2025.01); *H05K 2203/1545* (2013.01)

(58) Field of Classification Search
CPC ... B32B 37/025; B65G 15/30; H01L 21/6715; H01L 21/67706; H01L 21/6776;
(Continued)

(56) References Cited

U.S. PATENT DOCUMENTS 10,645,815 B2    5/2020    Landa et al.
10,834,824 B2    11/2020    Landa et al.
(Continued)

FOREIGN PATENT DOCUMENTS

DE    102010036561    1/2012
JP    H07187358    7/1995
(Continued)

*Primary Examiner* — Sonya M Sengupta
(74) *Attorney, Agent, or Firm* — Shalom Wertberger; Saltamar Innovations

(57) ABSTRACT

A system is disclosed for transferring a substance pattern to a substrate. The system comprises a web carrying the substance pattern, a web drive mechanism for driving the web through a nip between a roller and an opposing surface, and a transport mechanism for advancing a substrate having parallel side edges towards the nip, for the substrate to be gripped in the nip and frictionally driven through the nip at the same time as, and with the same speed as, the web, the web being pressed against a surface of the substrate during passage through the nip to cause the substance pattern to transfer from the web to the substrate. The lateral abutments located on opposite sides of the substrate are movable towards and away one another and resiliently biased to grip it, the abutments serving to align the substrate with the web and to advance it towards the nip.

20 Claims, 9 Drawing Sheets

(51) Int. Cl.
*H05K 3/20* (2006.01)
*H10F 71/00* (2025.01)

(58) Field of Classification Search
CPC ... H05K 2203/0522; H05K 2203/1545; H05K 2203/1572; H05K 3/1275; H05K 3/207; H10F 71/00
See application file for complete search history.

(56) References Cited

U.S. PATENT DOCUMENTS

| | | |
|---|---|---|
| 10,973,129 B2 | 4/2021 | Landa et al. |
| 11,546,999 B2 | 1/2023 | Landa et al. |
| 11,570,902 B2 | 1/2023 | Landa et al. |
| 11,751,336 B2 | 9/2023 | Landa et al. |
| 2015/0068867 A1 | 3/2015 | Nishimura et al. |
| 2021/0227698 A1 | 7/2021 | Landa et al. |
| 2022/0384228 A1 | 12/2022 | Landa et al. |
| 2023/0129839 A1 | 4/2023 | Landa et al. |
| 2024/0173954 A1* | 5/2024 | Landa ................. H01L 21/6715 |

FOREIGN PATENT DOCUMENTS

| | | |
|---|---|---|
| KR | 20180062754 | 6/2018 |
| WO | WO 2013/096436 | 6/2013 |
| WO | WO 2018/020483 | 2/2018 |

\* cited by examiner

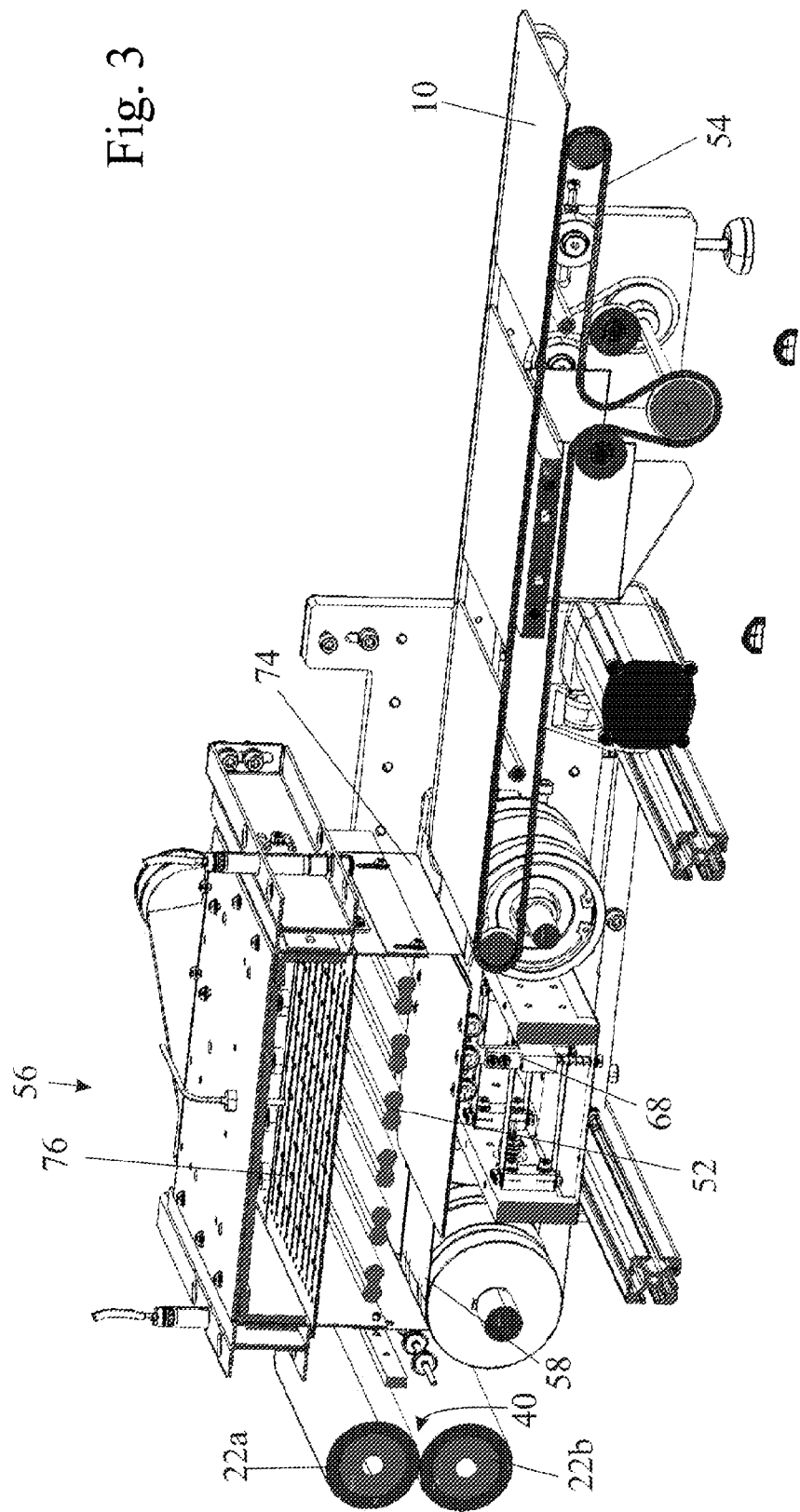

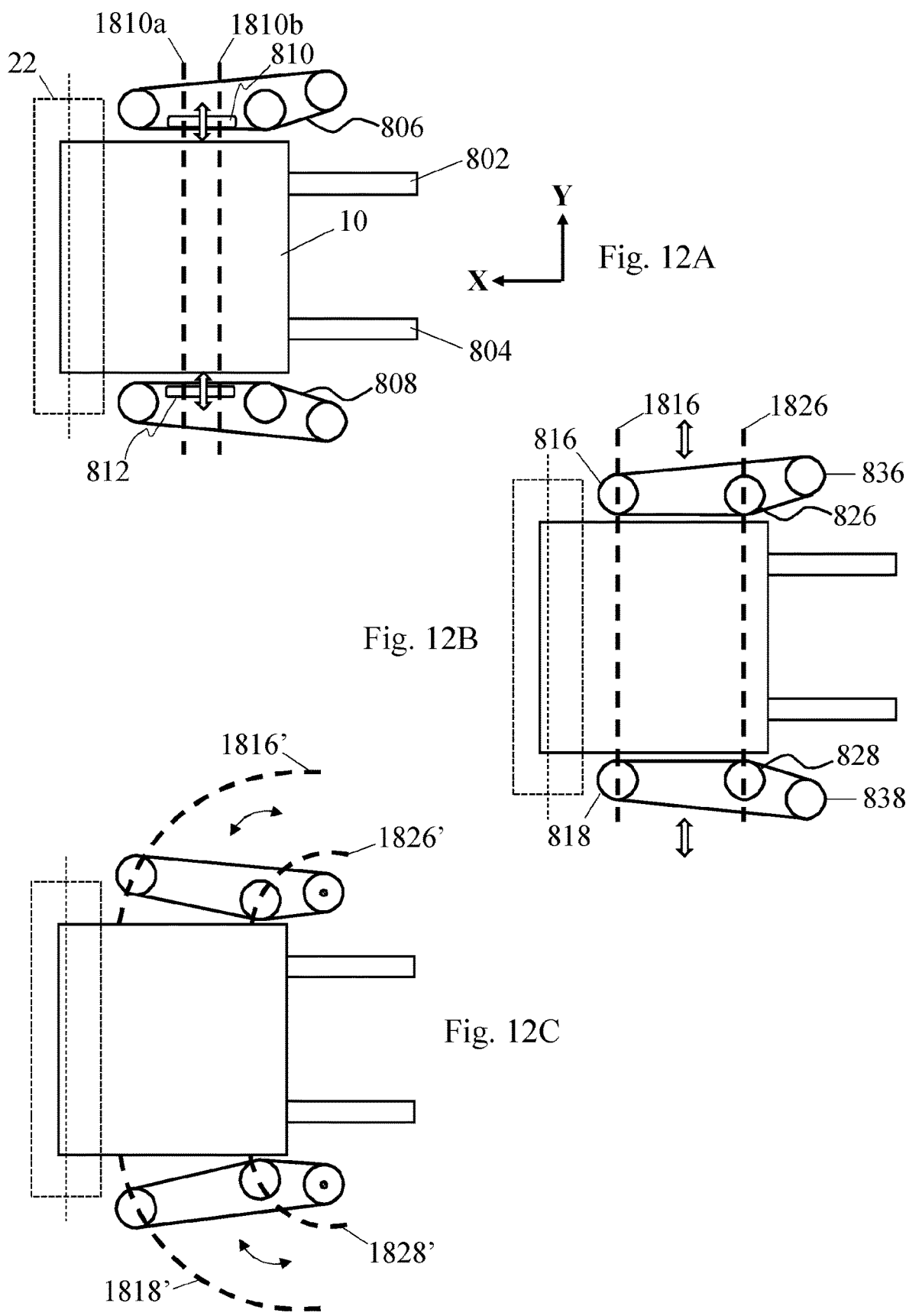

SYSTEM FOR INTRODUCING A SUBSTRATE INTO A NIP

CROSS-REFERENCE TO RELATED APPLICATIONS

This application is a National Phase entry of International Application No. PCT/IB2022/053159, filed on Apr. 5, 2022, which claims Paris Convention priority from Great-Britain patent application No. 2104962.2, filed on Apr. 7, 2021. The contents of these applications are incorporated by reference in their entirety as if fully set forth herein.

FIELD

The present disclosure relates to application of a substance pattern to a substrate by transfer from a flexible web.

BACKGROUND

In the manufacture of certain products, there arises a need to apply a substance pattern to a surface of a substrate. For example, in the manufacture of solar cells, circuit boards, touch screens and radio frequency identification (RFID) antennas, amongst other items, one may wish to apply to a substrate a substance that comprises a composition containing particles of an electrically conductive material, and typically a binder maintaining the particles in a desired shape (e.g., pattern of lines, cross-section of lines, etc.) and/or an adhesive which may enhance adherence to the intended substrate or facilitate any functional interaction therewith. The substrate may, for instance, be a semiconductor wafer in the case of a solar cell, or it may be an electrically insulating substrate in the case of a printed circuit board. While such substrates are typically rigid and planar, flexible and/or non-flat (e.g., curved) substrates may also be used. In some cases, for example for an RFID device, it may be desired to apply a substance pattern directly onto a three-dimensional item, such as part of the body of a piece of equipment, whereupon the surface may be flat or curved.

Various methods are known for applying a substance pattern to a substrate. Generally, the substance pattern is formed directly on the substrate. In some methods, where a pattern of a substance is not intended to cover the entire surface, selective deposition of a substance may be performed to achieve a desired pattern, for instance by screen-printing. In other methods, the entire surface of the substrate may be coated with the substance, then part of the substance may be selectively removed, such as by etching or laser ablation, to leave the desired pattern. Each of these approaches has its own advantages and disadvantages.

The present Applicant has previously proposed, in WO 2018/020479 and WO 2018/020481, forming the substance pattern on the substrate by first filling grooves formed in a flexible web with the substance and subsequently transferring the pattern from the flexible web to the substrate. WO 2018/020483, discloses an apparatus for transferring a pattern of a composition containing particles of an electrically conductive material and a thermally activated adhesive from a surface of a flexible web to a surface of a substrate, the apparatus comprising:
 i. respective drive mechanisms for advancing the web and the substrate at the same time through a nip at which a pressure roller acts to press the surfaces of the web and the substrate against one another,
 ii. a heating station for heating at least one of the web and the substrate prior to, or during, passage through the nip, to a temperature at which the adhesive in the composition is activated when the surfaces are in contact with one another,
 iii. a cooling station for cooling the web and the substrate after passage through the nip, and
 iv. a separating device for peeling the web away from the substrate after passage through the cooling station to leave the pattern of composition adhered to the surface of the substrate.

When the above apparatus is used to print a pattern by transfer at speed on fragile (e.g., thin and brittle) substrates, such as semiconductor wafers, the substrates risk being damaged or broken at the time of their being fed into the nip.

With a view to mitigating the foregoing problem, the present Applicant has previously proposed in WO 2021/079309, a system for transferring a substance pattern to a substrate, the system comprising a web carrying the substance pattern, a web drive mechanism for driving the web through a nip between a roller and an opposing surface, and a transport mechanism for advancing a substrate towards the nip for the substrate to be gripped in the nip and frictionally driven through the nip at the same time, and with the same speed, as the web, the web being pressed against a surface of the substrate during passage through the nip to cause the substance pattern to transfer from the web to the substrate, characterised in that upon the substrate being gripped in the nip, no further force is applied by the transport mechanism to the substrate to advance the substrate towards the nip, thereby avoiding compression of the substrate.

In the latter application, the substrate is advanced towards the nip by means of an abutment on the transport mechanism that engages the trailing edge of the substrate. If the speed of the transport mechanism is less than the speed of the substrate when frictionally driven through the nip, then the trailing edge of the substrate will automatically disengage from the abutment on the transport mechanism and thereby avoid application of a compressive force to the substrate.

OBJECT

The present disclosure seeks to provide an alternative system that inter alia avoids compression of the substrate during its transfer from the transport mechanism to the nip.

SUMMARY

According to the present invention, there is provided a system for transferring a substance pattern to a substrate, the system comprising a web carrying the substance pattern, a web drive mechanism for driving the web through a nip between a roller and an opposing surface, and a transport mechanism for advancing in an X-direction a substrate having parallel side edges towards the nip, for the substrate to be gripped in the nip and frictionally driven through the nip at the same time as, and with the same speed as, the web, the web being pressed against a surface of the substrate during passage through the nip to cause the substance pattern to transfer from the web to the substrate, characterised in that the transport mechanism comprises lateral abutments located on opposite sides of the substrate and movable relative to one another in a Y-direction traverse to the X-direction and resiliently biased towards one another to grip opposite side edges of the substrate, the lateral abutments serving to align the substrate with the web and to apply a force to advance the substrate towards the nip.

The transport mechanism may, in some embodiments, further comprise an endless conveyor for supporting the underside of the substrates driven at substantially the same speed as the web, the lateral abutments being mounted for movement with the conveyor. In such embodiments, the lateral abutments may be mounted on, or movable with, the endless support conveyor.

In alternative embodiments, the substrates may be supported on a low friction surface or on freely rotatable rollers. Regardless of how the substrates are supported, the lateral abutments may be belts or rollers rotatable about axes that are at a predetermined distance from the nip, at least one of the belts or rollers being driven to advance the substrate towards the nip.

Conveniently, the lateral abutments may comprise two opposed belts rotatable about vertical axes, both belts being driven to advance the substrate towards the nip at the same speed as the web.

In some embodiments, one or more sensors may be provided to determine the position of the leading edge of each substrate, to ensure arrival of the leading edge of each substrate at the nip at the correct time to align with a pattern on the web.

In all embodiments, the substrate need only be advanced by frictional contact, be it with the support conveyor or the abutments. Consequently, there is no mechanical or interlocking engagement of any form, that may risk compressing the substrates in the direction of travel of the transport mechanism. In this way, the present disclosure ensures correct alignment of the substrates with the web while minimising the risk of damage to brittle or frangible substrates.

In some embodiments, when the leading edge of a substrate is detected or predicted to have been engaged in the nip, the lateral abutments may be retracted to cease applying a force to advance the substrate towards the nip.

The engagement of the substrate within the nip may be predicted based on detection of the leading edge of the substrate at a fixed position preceding the nip and measurement of the movement of the abutments subsequent to the detection of the leading edge of the substrate. If, for example, the abutments are moved by a stepper motor, the substrate may be predicted to have reached the nip after a predetermined number of pulses has been applied to the stepper motor. Alternatively, the engagement of the substrate in the nip may be detected by detecting the pressure on, or displacement of, the roller of the nip.

To retract the lateral abutments, when formed by belts or rollers, the belts or rollers on opposite sides of the substrate may be mounted on separate platforms slidable in a direction transverse to the direction of movement of the substrate. The platforms may be movable independently of one another, thereby allowing each substrate to be positioned accurately in the direction transverse to its direction of movement to align correctly with the pattern to be transferred from the web to the substrate.

The absence of any abutment pin for engaging the trailing edge of substrates simplifies the loading of substrates onto the transport mechanism as there is no requirement to time the arrival of a substrate to coincide with the passage of an abutment pin. The substrates may be placed on the transport mechanism at any time and their position may be determined by suitable sensors, for example optically, to ensure that the leading edge of each substrate arrives at the nip at the correct time to align with a pattern on the web.

The purpose of the nip in the present disclosure is to apply a force urging the web and the substrate against one another to ensure transfer of the substance patterns from the web to the substrates. The substrate is gripped in the nip in the absence of forces being applied by the transport mechanism, thereby avoiding compression of the substrate between the nip and the transport mechanism. Hence, once the substrate is sufficiently engaged by the nip to be gripped and frictionally driven by it, the nip controls its motion going forward. The side of the nip opposite the roller over which the web passes (underneath which the substrate is driven) may either be another roller (e.g., a pressure roller) or a low friction surface (e.g., opposing surface) relative to which the substrates or the web can slide easily.

If substance patterns are to be transferred to both sides of a substrate from two different webs, both transfers may either take place at the same time while the two webs and the substrate pass through the same nip, or they may take place consecutively through two separate nips. In the former case, the nip can be constituted by two rollers facing one another, the two rollers being in one embodiment additionally symmetrical in size.

In accordance with a second aspect of the invention, there is provided a method of introducing a substrate having parallel opposite side edges into a nip defined between a pressure roller and an opposing surface through which the substrate is driven, in which method the substrate is advanced towards the nip by means of a transport mechanism having lateral abutments gripping the opposite side edges of the substrate, the substrate being advanced towards the nip by a force applied by the abutments.

In some embodiments, engagement between the abutments and the opposite side edges of the substrate is released upon the leading edge of the substrate being engaged within the nip. Advantageously, the lateral abutments are resiliently biased towards one another during the gripping of the substrate and are disengageable/retractable with respect to the sides of the substrate upon engagement of the substrate within the nip. In other words, the abutments on one side of the substrate are capable of being moved apart from (or conversely closer to) the abutments on the other side, this relative widening (or narrowing) of the distance separating the two being timed in response to the engagement of the substrate leading edge into the nip.

The disengagement need only affect lateral abutments sufficiently close to the nip to be in contact with the substrate when its leading edge reaches the nip, but alternatively, all lateral abutments can be moved apart, irrespective of their distance from the nip.

In some embodiments, whilst the method provides for the advancement of the substrate towards the nip in an X-direction by means of the transport mechanism, the lateral abutments may additionally serve to align the substrate in a Y-direction traverse to the X-direction, said alignment preceding the engagement of the substrate leading edge within the nip.

In some embodiments, the method of introducing the substrate further comprises driving a web carrying a substance pattern through the nip at the same time as, and with the same speed as, the substrate, the web being pressed against a surface of the substrate during passage through the nip to cause the substance pattern to transfer from the web to the substrate.

These and additional benefits and features of the disclosure, which are inter alia set forth in the appended claims, will be better understood with reference to the following detailed description taken in conjunction with the figures.

BRIEF DESCRIPTION OF THE DRAWINGS

Some embodiments of the disclosure will now be described further, by way of example, with reference to the accompanying figures, where like reference numerals or characters indicate corresponding or like objects. The description, together with the figures, makes apparent to a person having ordinary skill in the art how some embodiments of the disclosure may be practiced. The figures are for the purpose of illustrative discussion and no attempt is made to show structural details of an embodiment in more detail than is necessary for a fundamental understanding of the disclosure. For the sake of clarity and convenience of presentation, some objects depicted in the figures are not necessarily shown to scale.

In the Figures:

FIG. 3 is a perspective section view of the apparatus shown in FIG. 2;

FIG. 12A schematically depicts how lateral abutments of the embodiment of FIG. 8 may be disengaged from the substrate when the leading edge reaches the nip;

FIG. 12B schematically depicts how lateral abutments of the embodiment of FIG. 11 may be disengaged from the substrate when the leading edge reaches the nip; and FIG. 12C illustrates how lateral abutments may be disengaged from the lateral edges of the substrate using a modification of the embodiment of FIG. 11, in which the platforms supporting the abutments are rotatable instead of being slidable in the Y-direction.

DETAILED DESCRIPTION

Figure 1:
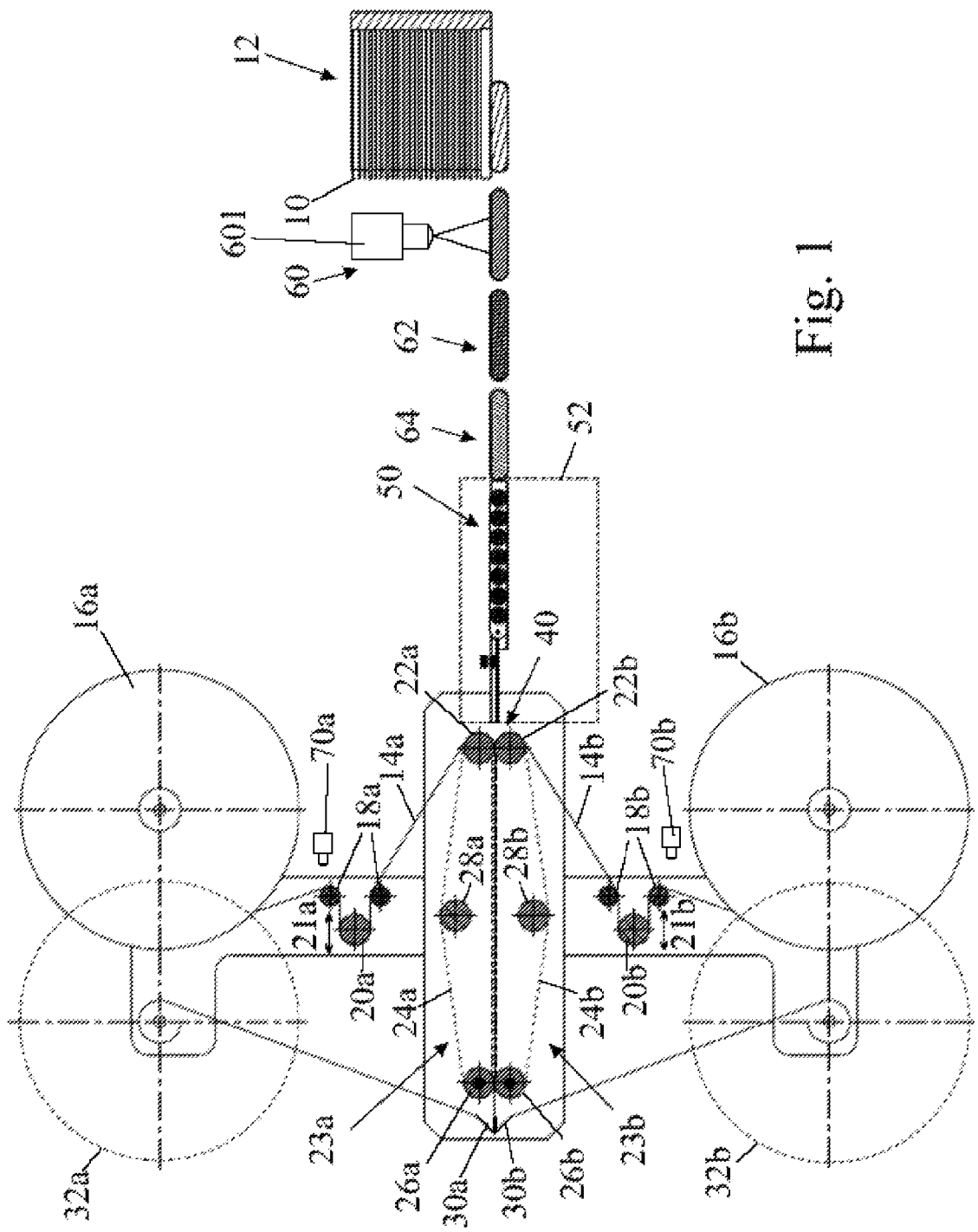
FIG. 1 illustrates a transferring system, as described in WO 2018/020483, for applying (e.g., electrically conductive) patterns to opposite sides of a substrate which can be modified according to the present teachings, in particular to include a novel apparatus for delivering a substrate.

The apparatus of FIG. 1, as described in more details in WO 2018/020483, is intended to apply a substance pattern to opposite sides of substrates 10, e.g., drawn from a stack 12 or from a cassette. For example, the substance of the pattern may be a composition that contains particles such as made of electrically conducting materials (e.g., electrically conducting particles made of metals or suitable alloys) and a thermally and/or pressure activated adhesive (e.g., a hot melt polyamide adhesive). Such patterns can be rendered electrically conductive, for example by application of energy to sinter the composition. The composition may not require the application of energy to become conductive, and in some cases electrical conductivity may not be required, the pattern, for example, having other functions or only being ornamental. If the pattern is to be treated to develop its desired functional and/or esthetical effect, for instance is to be heated to become electrically conductive, or to be fused or cured to increase adhesion to the substrate, this treatment is typically performed following transfer of the pattern from the web to the substrate.

Thus, in one example considering a functional pattern able to conduct electricity, the substrates 10 may be semiconductor wafers onto which the apparatus applies the front and back electrodes of the desired end-product, which may be a solar cell. The transferred patterns may constitute at least part of the patterns desired on the substrate, for example they may form a grid-like pattern of fingers of a solar cell, transversal bus bars optionally being separately applied by a similar or different method. The two conductive patterns applied on opposite sides commonly differ from one another but may need to be each correctly aligned with the substrate (hence also with one another on each side of the substrate). In another example, the end-item may exclude a semiconductor wafer (e.g., may be an electrically insulating substrate, plastic, glass, etc.), may have functionality other than of a solar cell (e.g., functionality of a circuit board, an RFID antenna, a display, a touch screen, etc.), and/or may be purely decorative.

In the non-limiting example of the substrate drive mechanism illustrated in FIG. 1, substrates 10 are dispensed one at a time from a stack 12 and can be advanced to an inspection station 60 where the upper surfaces of the substrates can be analysed optically for defects by a camera 601. In a selection station 62 that follows, substrates found to be defective can be ejected.

Substrates 10 (preferably pre-inspected to be without defects) are advanced by a conveyor and alignment device 50 where they can be heated by a heater 52. Optionally an adhesive adapted to improve the transfer of the pattern from the web and/or its retention on the substrate may be applied to the surface of the substrates or to parts thereof. After being heated, if desired, and correctly positioned and oriented, the substrates 10, which may optionally be coated at least in part with an adhesive, are fed into a nip 40 defined between two pressure rollers 22a and 22b, which may be identical and symmetrical, as illustrated in FIG. 1.

While the inclusion of an inspection station 60 and a selection station 62 to detect and eject defective substrates is recommended, such stations are not essential for the operation of the apparatus, being only preferable from a quality control standpoint. Stations fulfilling similar roles downstream of the nip, e.g., following the peeling of the flexible web, can optionally be additionally or alternatively included to detect defective patterns and eject substrates bearing such defects, and/or to sort into various bins in accordance with quality level.

In the event that the apparatus does comprise stations 60 and 62 upstream of the nip, it can be desired to further include an accelerating station 64 allowing a non-defective substrate being drawn after a defective one, which was therefore ejected, to reach the nip in synchronism with the pattern(s) of the web(s). Such accelerating station 64 may therefore prevent an "empty" feeding of the web at the nip, in absence of a substrate. Such an accelerating station is, however, not essential as such empty feeding can be tolerated or mitigated by alternative means, such as adding a substrate pre-selected as flawless from a buffer of such non-defective wafers, or by any like solution.

Similar inspection stations may be placed at additional positions in the apparatus and configured to send relevant instructions to the system in response to the situations they are aimed to detect and signal. For instance, in case of substrate misfeeding, which can be detected by a sensor positioned upstream to the nip, the inspection station may cause the interruption of substrate feeding, the deceleration of web feeding and the cessation of operation of the apparatus (at least for the duration of the removal of the misfed substrate).

The patterns of substance that include the desired composition that are to be transferred to the substrates are carried by two flexible webs 14a and 14b, which as mentioned need not be the same. As can clearly be seen from FIG. 1, the drive mechanisms of the two webs 14a and 14b can be mirror images of one another, but this need not be the case and alternative configurations are possible, as illustrated in, and described below by reference to FIGS. 4a, 4b and 5. To avoid repetition, reference numerals without a suffix will be used in the present description to refer generically to components of both web drive mechanisms but suffixes "a" and "b" are used in the drawings to distinguish between the upper and lower drive mechanisms.

Each web 14 is drawn from a supply roll 16, for instance, by way of idler rollers 18 and a dancer 20 that can move from left to right as represented by an arrow 21. The dancer 20 can serve to tension the web and also to ensure correct registration of the patterns on the web 14 with the substrates 10. When two webs are employed to apply substance patterns on opposite sides of the substrate, the tension rollers that may be present along each of their respective path can serve to achieve registration between the patterns carried by both webs.

Typically, when the web 14 is drawn from supply roll 16 the composition is level with the surface of the web and generally, but not necessarily, essentially dry. Optionally, an adhesive adapted to improve the transfer of the pattern from the web and/or its retention on the substrate may be applied to the web 14 subsequent to the drawing of the web 14 from supply roll 16 and prior to its contacting the substrate (e.g., upstream of the nip). The web 14 passes between the two pressure rollers 22 that define the nip 40 into which substrates 10 are fed. Within the nip 40, the substance/composition pattern on the web 14 is pressed against a surface of the substrate 10 resulting in the pattern of substance/composition adhering to the substrate. The web 14 may then pass through an optional cooling station 23, between two rollers 26, and be separated from the substrate 10, e.g., by a separating device 30 or by forming a take-up angle suitable for separation. After separation from the substrate 10 for instance by the device 30, the web can be rewound on a take-up roll 32. If desired, the take-up 32 roll can be returned to the web supplier for recycling.

In the event that the take-up roll 32 is discarded, the web 14 may be referred to as a disposable flexible web or film. The process employing the webs as herein disclosed may be referred to as a "roll to roll" method, the webs from which patterns are transferred to the substrates being drawn from supply roll 16 and rewound on take-up roll 32.

If peeling is not desired, for example, because web 14 may additionally serve to protect substrate 10, separating device 30 and take-up roll 32 may be omitted from the apparatus. The term "transferred" as used herein for a pattern of composition and variants thereof should be understood to also cover embodiments where the web and the substrate are not separated from one another. If cooling is not desired, for example, because the substance pattern is transferred by pressure and/or the transfer is not performed at an elevated temperature and/or the web need not be rapidly separated from the substrate, cooling station 23 may be omitted from the apparatus or turned off.

For the purpose of ensuring correct registration of the patterns of substance/composition with the substrates 10, optical sensors 70 may be provided to sense the location of the patterns on the web 14, e.g., upstream of the idler rollers 18. The type of sensors, their positioning along the paths followed by each of the webs and the substrate, the signals they may provide to a system adapted to control and take responsive actions and the responses they may trigger to different parts of the apparatus in order to ensure correct registration or to reduce erroneous registration within tolerance are known to the skilled persons and need not be detailed herein.

By way of non-limiting example, a controller may set a first speed to a web and adjust a second speed of the substrates while on the transportation conveyor, upon (and prior to) engagement of the substrate into the nip. The circumferential speed of the at least one pressure roller of the nip is essentially the same as the linear speed of the web, so that when comparing the speed of the substrate to the speed of the nip, reference is made to the corresponding linear speed of each.

While the figures schematically illustrate an apparatus allowing simultaneous transfer of two patterns onto respective opposite surface of the substrate, the skilled person can readily appreciate how a similar apparatus can be prepared to transfer patterns of substance/composition on a single substrate side or on a single substrate side at a time (e.g., two nips being required to sequentially apply a pattern from a first web to a first side and a pattern of a second web on a second side). In such a case, nip 40, whether sole, first or second nip of the apparatus, for instance, can be formed between a single pressure roller 22 and a backing support 34 for substrate 10. The backing support may be static (e.g. a plate, the pressure roller and/or the movement of the web driving the displacement of the substrate thereupon) or may be in motion (e.g., a conveyor adapted to transport the substrate at a speed selected to match the relative movement of the respective web). As a nip includes at least one pressure roller 22 (e.g., 22a), the surface against which pressure is applied may be referred to as an opposing surface or a backing surface 36, which as mentioned can be a second pressure roller (e.g., 22b) or a backing support 34, and may provide for a static or a dynamic surface upon closing of the nip in operation of the system.

Figure 4A:
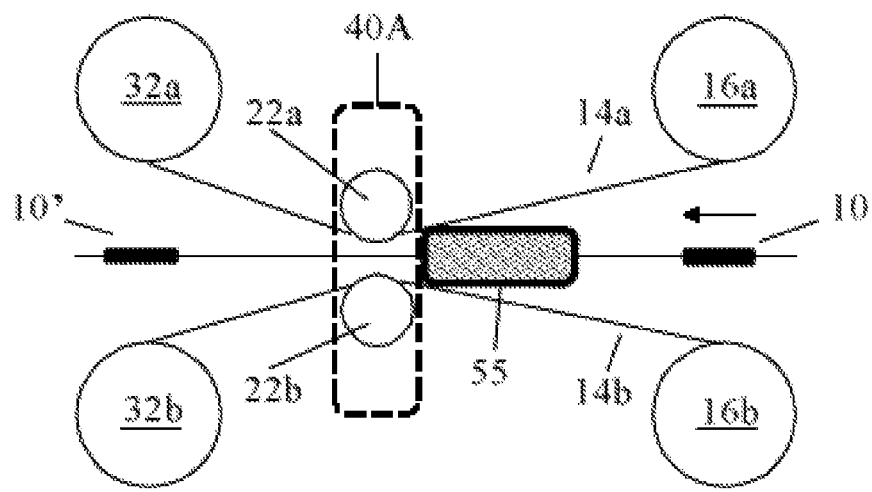
FIGS. 4a and 4b schematically depict nips to which a substrate feeding mechanism according to the present disclosure may deliver substrates for the application of a substance pattern on one or more of its opposite surfaces.
Figure 4B:
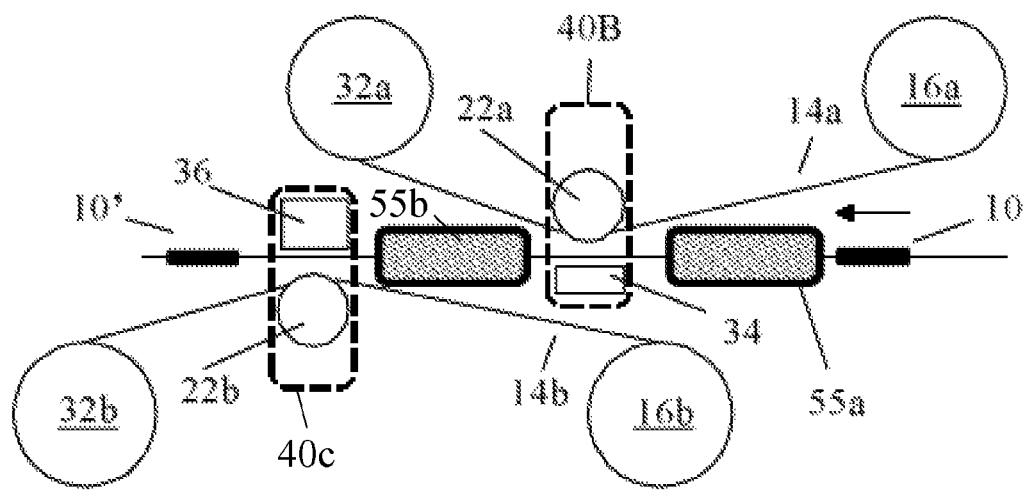

FIGS. 4a and 4b illustrate alternative nip configurations in a highly schematic manner. FIG. 4a depicts a system wherein a substrate 10 is fed to a nip 40A in the direction of the arrow, to receive on its two sides substance patterns delivered respectively by webs 14a and 14b, each being supplied by a supply roll 16a or 16b and ultimately taken up by rewound rolls 32a or 32b, accordingly. The substrate 10 is fed to nip 40A formed by two pressure rollers 22a and 22b via a feeding mechanism 55 to be later detailed and exits the nip following transfer of patterns as 10'.

FIG. 4b depicts systems wherein a substrate 10 is fed to a nip 40B in the direction of the arrow, to receive on a single one of its two sides substance patterns delivered by web 14a being supplied by a supply roll 16a and taken up by rewound roll 32a. The substrate is fed to nip 40B formed by pressure roller 22a and backing support 34 via a feeding mechanism 55a The substrate may optionally sequentially enter a second nip 40C formed by pressure roller 22b and backing surface 36 via a feeding mechanism 55b. Nip 40C allows for the application of a second substance pattern on the other side of the substrate, the second patterns being delivered by web 14b supplied by a supply roll 16b and taken up by rewound roll 32b. Nips 40A and 40B are examples of nip 40C and while the configuration of nip 40A may be preferred for synchronous application of substance patterns on both sides of a substrate, all three configurations may be used to apply a pattern on a single side of the substrate or to sequentially apply a pattern one side at a time.

Regardless of nip configuration, the pressure rollers 22 and backing surfaces 36 (e.g., backing supports 34) composing the nip 40 may be configured to suit the webs and substrates intended to pass therebetween. For instance, they may form suitable gaps, or have suitable dimensions, shapes or surface topography, suitable friction properties, suitable compressibility (e.g., to urge intimate contact between the web and a face of the substrate), suitable hardness (e.g., adapted to the substrate mechanical properties), and like considerations readily appreciated by a skilled person. Such properties of the pressure rollers or backing supports may be inherent to the part or provided by a suitable coating of the part.

In some embodiments, pressure roller 22 (or a backing support thereto) can be coated with a material (e.g., a polymeric compound or blend) so as to provide on its outer surface an external layer 25 having a hardness of no more than 100 Shore A, no more than 90 Shore A, no more than 80 Shore A, no more than 70 Shore A, no more than 60 Shore A, no more than 50 Shore A, or no more than 40 Shore A. In some embodiments, pressure roller 22 has an outer surface hardness of at least 10 Shore 00, at least 30 Shore 00, at least 50 Shore 00 (which approximately correspond to 10 Shore A), at least 20 Shore A, or at least 30 Shore A.

In some embodiments, pressure roller 22 (or a backing support thereto) can be coated with a material so as to provide on its outer surface an external layer 25 alternatively or additionally serving as a compressible layer adapted to ensure the proper contacting of the surfaces of the web and the substrate when passing through the nip.

Figure 5:
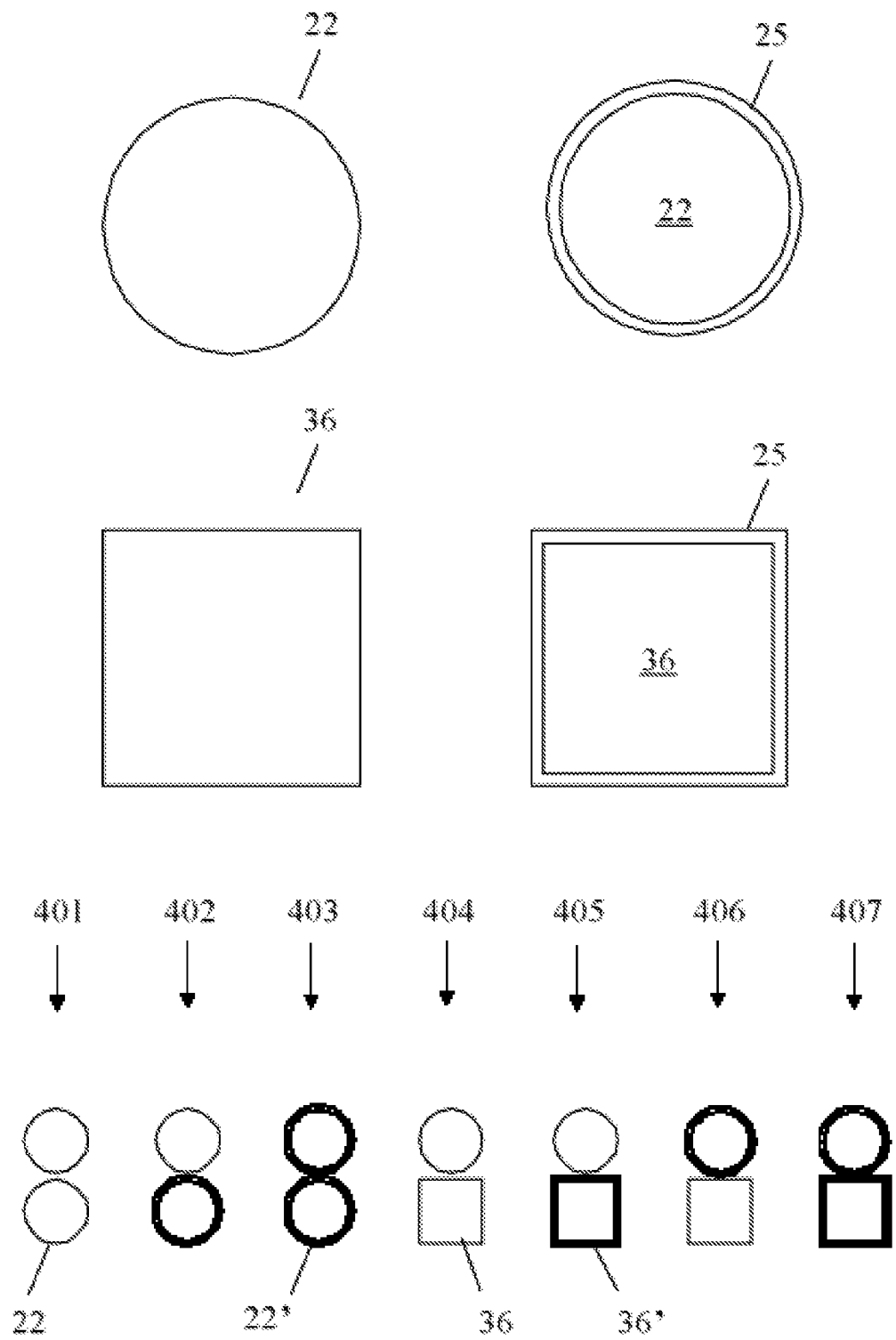
FIG. 5 schematically depicts how pressure rollers and backing surfaces may be further coated and combined according to various embodiments of the present disclosure so as to form nips that may be implemented with a substrate feeding mechanism, such as illustrated inter alia in FIGS. 4a and 4b.

FIG. 5 schematically illustrates these alternatives of having a pressure roller 22 or a backing surface 36 uncoated or coated with an external layer 25. For the sake of the possible combinations of the same, being depicted by nips 401 to 407, the coated versions of the pressure roller and the backing surface shall be referred to in this figure by 22' and 36' respectively.

The parts forming the nips (e.g., pressure roller 22 and backing surface 36) are preferably capable of disengagement one from another, allowing for instance to adjust a distance between them (e.g., moving at least one of the two pressure rollers 22a and 22b one toward or away from the other), such as for adapting the nip gap to the substrate and/or webs thickness, or for threading a web, or for removing a misfed substrate, and like conventional operation and maintenance that may be required at a nip.

As closing of a nip to form a gap suitable for transfer may cause a mild (typically backward) displacement of the web contacted by the part being moved, the webs may be accordingly positioned prior to closing to take this phenomenon into account. For instance, one of the two webs 14 may be intentionally advanced with respect to the other in a manner which causes the patterns carried by the webs to be non-aligned prior to the closing of nip 40, so that the webs and their respective patterns be correctly aligned (e.g., within tolerance) upon closing of the nip. The extent of intentional pre-nip-closing misalignment due to provide correct alignment following nip closing can be calculated based on nip configuration and operation or can be empirically determined. Correct alignment following closing of the nip can be determined visually prior to starting or restarting the web drive mechanisms or with the assistance of suitable sensors in operation of the apparatus.

While nips between at least one pressure roller and a backing surface are considered as ideally forming a line of contact, this is typically not the case, the pressure being applied at the nip and the fact that its constituting parts may be coated with materials slightly deformable under such pressures resulting in nips forming a longitudinal area of contact between the web and the substrate. Accordingly, the sufficient engagement of the leading edge of the substrate at the nip may not require that it pass a virtual line of contact, but that there be enough gripping in the area of contact even upstream of such line for the at least one friction roller of the nip to frictionally drive the substrate. The minimal length of engagement of the substrate in the nip for the pressure roller(s) to control from said engagement onward the speed of the substrate may depend on the diameter of the pressure roller, the hardness of its outer surface, its coefficient of friction with respect to the substrate to be gripped, and the pressure applied thereto, to name few factors that may determine the extent of engagement required to sufficiently grip the substrate. If for illustration sufficient gripping is achieved when the five leading millimeters of a substrate having a length of 210 mm (e.g., about 2.5% of the substrate length) are engaged in the nip and the contact area of the nip has a width of 16 mm symmetrically divided into 8 mm upstream and downstream of the virtual line of contact, then in this case sufficient leading engagement and gripping can be achieved even when the front edge of the substrate is upstream and 3 mm away from the line of contact. Sufficient engagement of a substrate into the nip to an extent allowing the one or more pressure rollers of the nip to frictionally drive the substrate can be determined by routine experimentation under the applicable operating conditions. Therefore, terms such as engagement at the nip or by the nip encompass such proximal gripping optionally taking place upstream of the virtual line of contact of the nip.

The optional cooling of the substrates to which the webs are still attached in a cooling station 23 is effected in FIG. 1 by an endless belt 24 that also passes through the nip between the rollers 22 and the nip between the rollers 26 and further passes over an idler roller 28. Other cooling methods and devices may be alternatively used for this purpose. In some of such methods and devices, rollers 26 may be omitted. In an alternative approach, the web (and in turn to some extent the substrate) may be cooled by conduction by being brought into thermal contact with a "static" heat sink (e.g., a conventional heat exchanger passively or actively refrigerated by a fluid, and optionally including a number of fins to facilitate heat dissipation). For example, the heat sink may extend between the nip and a point on the path at which the web is separated from the substrate (e.g., by separating device or by web forming an angle with the substrate sufficient to achieve separation). The web(s) and/or the substrate may be maintained in thermal contact with the heat sink by way of one or more rollers urging such contact. In some embodiments, these roller(s) may additionally act as a portion of the heat sink. For instance, such rollers may optionally be cooled (e.g., liquid cooled).

Regardless of the means and methods used to cool the web(s) and/or the substrate, such cooling is adapted so that the web reaches the separation point (e.g., the separating device) at a particular temperature, so as to facilitate the separation of the web away from the substrate and/or the adhesion of the pattern of composition to the surface of the substrate. Without wishing to be bound by any particular theory, it is believed that peeling the web from the substrate at a temperature below the softening temperature of the web and below the softening temperature of the composition (e.g., the softening temperature of polymers comprised in the composition, for instance adhesives and in particular thermally activated ones) may assist these processes. For example, the temperature of the web following cooling and upon separation can be at most 60° C., at most 50° C., or at most 40° C.

Following this rationale, a cooling station may, in some embodiments, not be necessary to the apparatus. For instance, if the transfer is effected at relatively moderate temperatures at which the pattern may sufficiently transfer to the substrate and attach thereto, a cooling step may not be required. This can the case, for instance, if the adhesive of the composition is a pressure sensitive adhesive, or if an additional adhesive is applied to the substrate, the webs, or selected regions thereof.

When using the apparatus shown in FIG. 1 at elevated speed, damage (e.g., breakage) of substrates 10, when thin and brittle, may be observed in a commercially significant proportion. While breakage of relatively fragile substrates can be reduced or prevented by uniform speed reduction of the apparatus, such approach accordingly reduces productivity. The present disclosure provides an alternative feed mechanism that is intended to replace corresponding components upstream of the nip 40 to achieve a lower breakage rate, preferably less than 1.5%. While the feed mechanism of the present invention is advantageous for relatively fragile substrates, its use need not be limited to such substrates, since being capable of transferring patterns at relatively high velocities increases productivity regardless of the substrate type. The apparatus downstream of the nip 40, which can be, for instance, essentially as described in WO 2018/020483 and U.S. Pat. No. 10,834,824, may be retained without modification or be adapted as described herein.

Likewise, components upstream of the nip only facilitating the operation of the alternative feed mechanism according to the present teachings, or not being related thereto, may be preserved. For instance, a subsystem ensuring the timely delivery of a pattern carried by a flexible web can be similar in principle and architecture to one previously described by the Applicant, or otherwise known in part from the art, or adapted as further described herein. Such known components shall not be detailed herein and interested readers are referred inter alia to WO 2018/020483 and U.S. Pat. No. 10,834,824, which are incorporated by reference in their entirety as is fully set forth herein. New architectures will be described in following sections.

Figure 2:
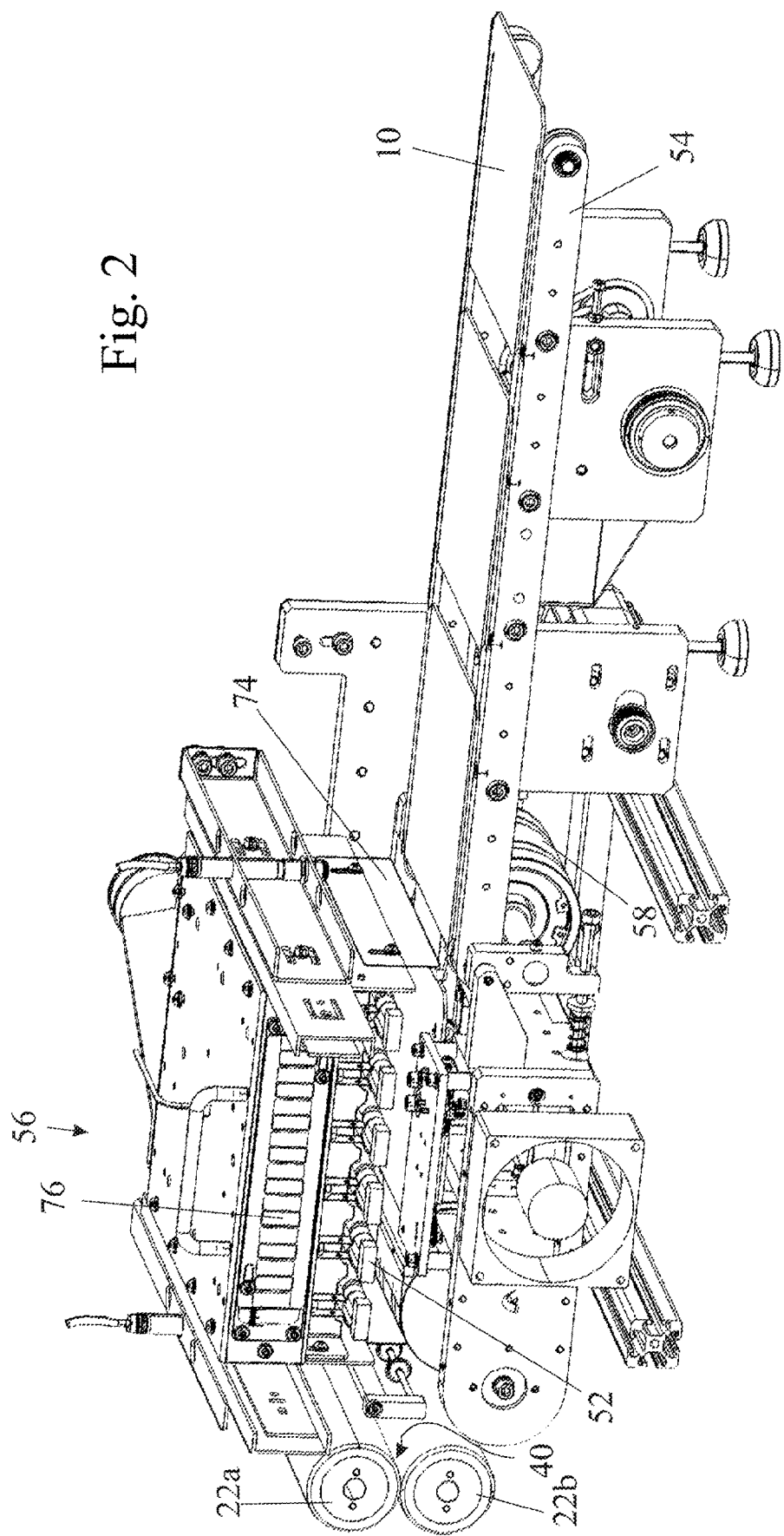
FIG. 2 shows a perspective view of a feeding mechanism for delivering a substrate to a nip at a correct time and speed in accordance with an embodiment of the present disclosure.

FIGS. 2 and 3 show an apparatus 56 for feeding substrates 10 to a nip 40 between two rollers 22a and 22b such as described above. The apparatus comprises two separately driven conveyors, herein termed a feeding (or feed) conveyor 54 and a transportation (or transport) mechanism 58, to distinguish them from one another. The purpose of the feeding conveyor is to transfer substrates 10, one at a time from a suitable supply, such as a stack or a cassette, to the transport mechanism 58. The purpose of the transport mechanism 58 is first to establish an exact positioning (e.g., by way of a sensor detecting the positioning) of each substrate 10 and then to advance the substrate 10 to the nip 40 for it to arrive at the nip 40 at a time that is synchronised with the motion of the webs carrying the substrate patterns, so as to achieve correct registration between the patterns and the substrates.

As readily appreciated by persons skilled in registration of patterns on a surface or with respect to one another, such matters typically allow for some tolerance which may be expressed in relative terms (e.g., percentage of deviation) or in absolute terms (e.g., distance from intended positioning). For example, in the case of functional patterns, a registration may be deemed correct if within a tolerance of +/−100 micrometre (μm) or less, or +/−75 μm or less, or −/−50 μm or less, or +/−20 μm or less, or −/−10 μm or less from exact positioning. For illustration, the patterns are correctly registered if within +/−50 μm in each of the X-direction (the direction of movement of the conveyors 54 and 58) and the transverse Y-direction from the desired positioning with respect to the various (leading, trailing, right and left) edges of the substrate and, if patterns are applied on both the top and bottom surfaces of the substrate, if within −/−50 μm in each of the X-direction and Y-direction from the desired positioning with respect to one another. In the case of purely ornamental patterns, such tolerance can be further relaxed and a pattern applied within a few millimetres (mm) from its intended position may still be correctly registered if visually satisfactory for its desired decorative purpose.

Notably, the aforesaid levels of registration, in other words the relatively small deviations (e.g., ≤+/−100 μm) observed between an intended position of the pattern (or a point therein) and its actual position on the substrate can be achieved by the systems of the present disclosure in an ongoing manner, while both the flexible web carrying the pattern to be transferred and the substrate are in motion.

For comparison, a standard device for feeding such substrates (e.g., as conveyor 54 upstream of transport station 56) may deviate by 200 μm or more from intended positioning. To the extent that the substrate would be laterally guided, this usually results from the presence on both sides of relatively compressible and/or supple guides (e.g., lateral belts of a centering system). In traditional systems, in which the pattern is directly applied to the surface of the substrate (e.g., by printing), such relatively high deviations from accurate positioning of the substrate are generally compensated by the according repositioning of the material to be deposited for the formation of the pattern. For illustration, if a pattern of substance is applied to a substrate by screen printing, typically the process is a stop-and-go process in which the screen is positioned with the desired accuracy above the substrate, once the progression of the substrate is interrupted at a "stop-position". Taking for example a process for manufacturing solar cells by such stop-and-go method, the yield than can be achieved can be of up to 3600 wafers per hour, a single wafer being printed with a solar cell pattern every second.

Advantageously, the devices and systems according to the present teachings allow ongoing alignment of the substrate with a pattern being carried by the flexible web, without having to stop any one of them to ensure desired registration of the pattern being transferred at intended position on the substrate. Such continuous method of alignment and transfer naturally enables a yield that can be greater than in conventional stop-and-go processes, the yield being, for a comparable illustration of substrates being wafers suited for the preparation of solar cells, of more than one wafer per second. In some embodiments, the devices, systems and methods as herein disclosed enable a yield of 1.5 wafers per second or more, 2.0 wafers per second or more, 2.5 wafers per second or more, or 3.0 wafers per second or more. As the yield depends inter alia on the length of the substrate, the gap between adjacent substrates and the speed afforded by the transport mechanism, the productivity may even be of up to 6.0 wafers per second for wafers of M12 standard size (i.e. having a length of 210 mm), being greater for shorter substrates (e.g., boards for printed circuits or M0 solar wafers) or smaller for longer ones.

The speed of the feeding conveyor 54 is controlled through an electric motor with its speed monitored using an encoder. The feeding conveyor 54 may comprise two spaced apart cyclically movable endless belts running parallel to one another, each side edge of the substrate 10 resting on, and supported by, a respective one of the two belts. As such, the belts should be spaced apart less than the width of the substrate 10 to be transported. The substrates 10 may be delivered to the feeding conveyor 54 by drawing substrates 10 from a stack or cassette or by a further station upstream of the feeding conveyor 54.

The reason that the feeding conveyor 54 is formed of two separate belts is that, at its downstream end, the two belts straddle the upstream end of the transport mechanism 58 creating an overlap region at which the individual substrates are transferred from the feeding conveyor 54 to the transport mechanism 58.

In some embodiments, one or more of inspecting, selecting, laser doping or any other process may be carried out while the substrates 10 lie on the feeding conveyor 54. In other embodiments, the feeding conveyor 54 acts only as a means of transferring substrates 10 from a stack or cassette to a transportation station, generally designated 56.

The transportation station 56 comprises a transport mechanism 58, different embodiments of which will be described below by reference to FIGS. 6 to 11. Correct alignment between the pattern carried by a web and the substrate onto which it is to be transferred, in the X-direction as defined above, is ensured by correctly timing the movement of the transport mechanism. Alignment in the transverse Y-direction is ensured in the different embodiments of FIGS. 6 to 11 by different forms of alignment abutments that engage the side edges of the substrates and displace them, if necessary, in the transverse Y-direction, while it is on the transportation conveyor 58.

In some embodiments, the feeding conveyor 54 and the transport mechanism 58 are configured and adapted to feed substrates to a nip 40 at a linear speed of at least 0.1 meter/second (m/s), at least 0.5 m/s, or at least 0.7 m/s. Typically, a linear speed of a substrate at a nip does not exceed 2.0 m/s, and is generally in a range of 0.2 m/s to 1.5 m/s, of 0.4 m/s to 1.0 m/s and of 0.5 m/s to 0.8 m/s. Remarkably, systems of the present disclosure have demonstrated their ability to accurately align substrates with the patterns to be transferred thereto to be in absolute terms within less 100 µm from an intended position in either the X-direction, the Y-direction, or both, at a speed of 0.7 m/s or more. In some embodiments, the deviation from intended position in at least one of the X- and Y-direction at such a speed of 0.7 m/s or more is in absolute terms of less than 75 µm, less than 50 µm, less than 25 µm, or less than 10 µm.

Figure 6:
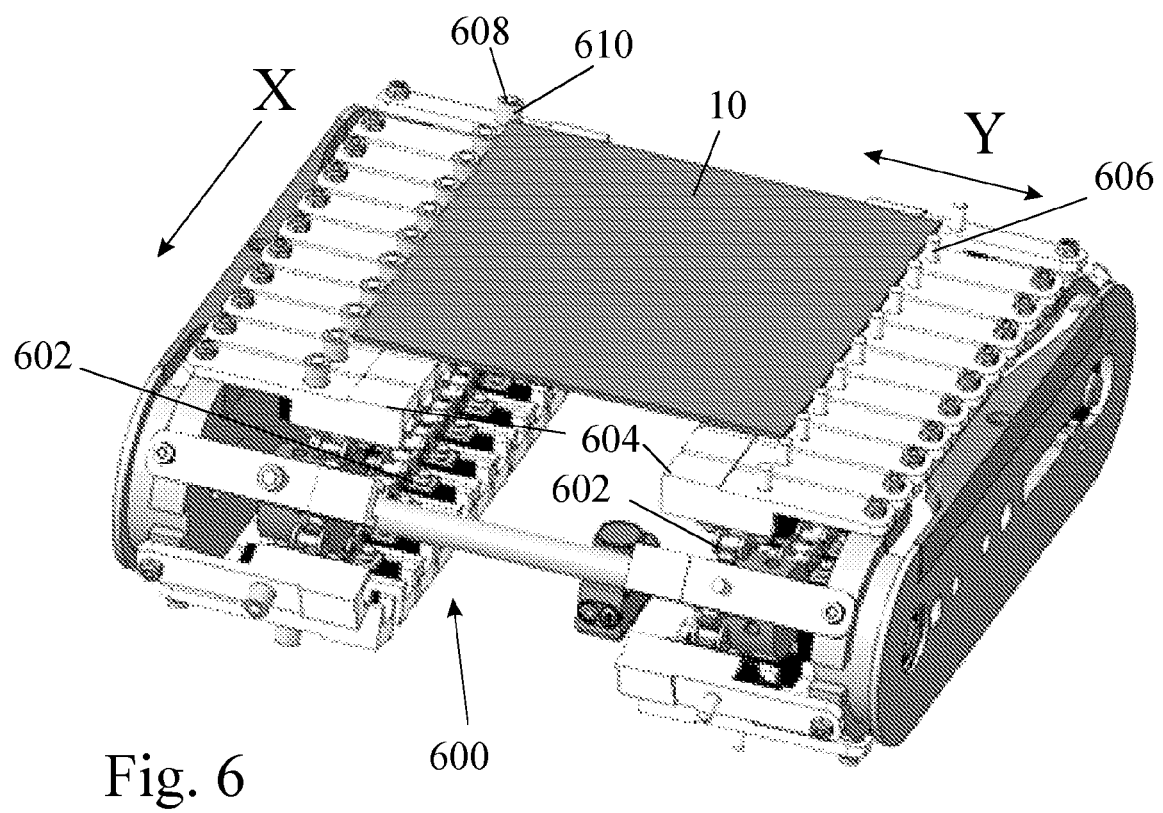
FIG. 6 is a perspective view of a transport mechanism of a first embodiment of the present disclosure.
Figure 7:
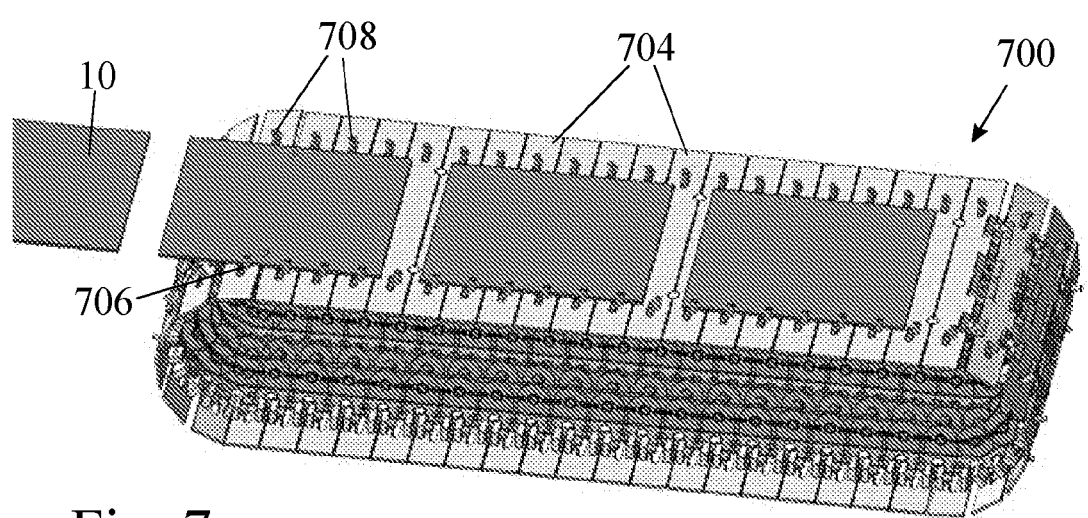
FIG. 7 is a perspective view of a transport mechanism of a second embodiment of the present disclosure.

The transport mechanism 600 in FIG. 6 comprises an endless conveyor formed of two chains 602, of which the links are connected to sliders 604 that are advanced by the chains while being slidable relative to the chain in the transverse Y-direction. In FIG. 6, some of the sliders have been omitted to permit the chains 602 to be seen. The sliders 604 have on their undersides cam followers that engage in cam grooves extending alongside the chains, causing the sliders 604 to slide in the Y-direction as they are driven in the X-direction by the chains 602.

The sliders 604 on one side of the transport mechanism 600 have hard pins 606 to engage one lateral edge of a substrate resting on the sliders 604 while pins 608 on the sliders on the other side of the transport mechanism are covered with resilient sleeves 610.

The cam grooves are shaped so that at the entry end of the transport mechanism 600, the pins 606 and 608 are further apart than the width of the substrates 10 and allow latitude in the position of the substrate in the Y-direction at the time that it is received by the conveyor. While resting on the sliders 604 under its own weight, the substrate 10 is advanced by friction with the sliders 604 towards the nip. While the substrate is so supported, the cam grooves interact with the cam followers of the sliders 604 to urge the pins 606 and 608 towards one another until their distance apart corresponds to the nominal width of the substrate 10. One purpose of the resilient sleeves 610 on the pins 608 on one side of the conveyor is to allow for variations within the manufacturing tolerance of the substrates 10.

The pins 606 define the precise position of the substrate 10 in the Y-direction as it reaches the nip and the pins 608 apply a force to urge the substrates 10 against the pins 606 without risk of damage to the substrates 10. The engagement of the substrates 10 with both the sliders 604 and the pins 606, 608 is only frictional so that if a substrate 10 is advanced towards the nip with a greater speed than its passage through the nip, it will merely slip relative to the conveyor 600 and will not be compressed in the X-direction.

In such an embodiment, it is possible when the leading edge of substrate 10 is sufficiently engaged by the nip 40, to separate the lateral pins 606, 608 that are in contact with the substrate 10, for example by moving in the Y-direction the cams acting on the sliders 604. In this way, on reaching the nip, the substrate is advanced only by the nip and no compressive forces are applied by the transport mechanism to the substrate. The transport mechanism 700 shown in FIG. 7 operates on the same principle as that of FIG. 6 but fixed plates 704 are attached to the chains instead of sliders. In this embodiment, it is the pins 706 and 708 that move relative to the plates 704 under the action of cam followers engaging in cam grooves. Once again, the pins 706 on one side are rigid and define a fixed position in the Y-direction as the substrates 10 enter the nip while the pins 708 on the opposite side are resiliently urged against the opposite lateral edges of the substrates 10. Similarly to the situation described with respect to transport mechanism 600, upon sufficient engagement of the leading edge of substrate 10 by nip 40, a mechanism acting on the cams can separate the lateral pins 706, 708 which are at a distance of the nip essentially corresponding to at most the length of the substrate, so that transport mechanism 700 is disengaged from the substrate at such time point, the substrate therefore entering the nip as previously aligned and in absence of compressive forces applied by the transport mechanism.

Figure 8:
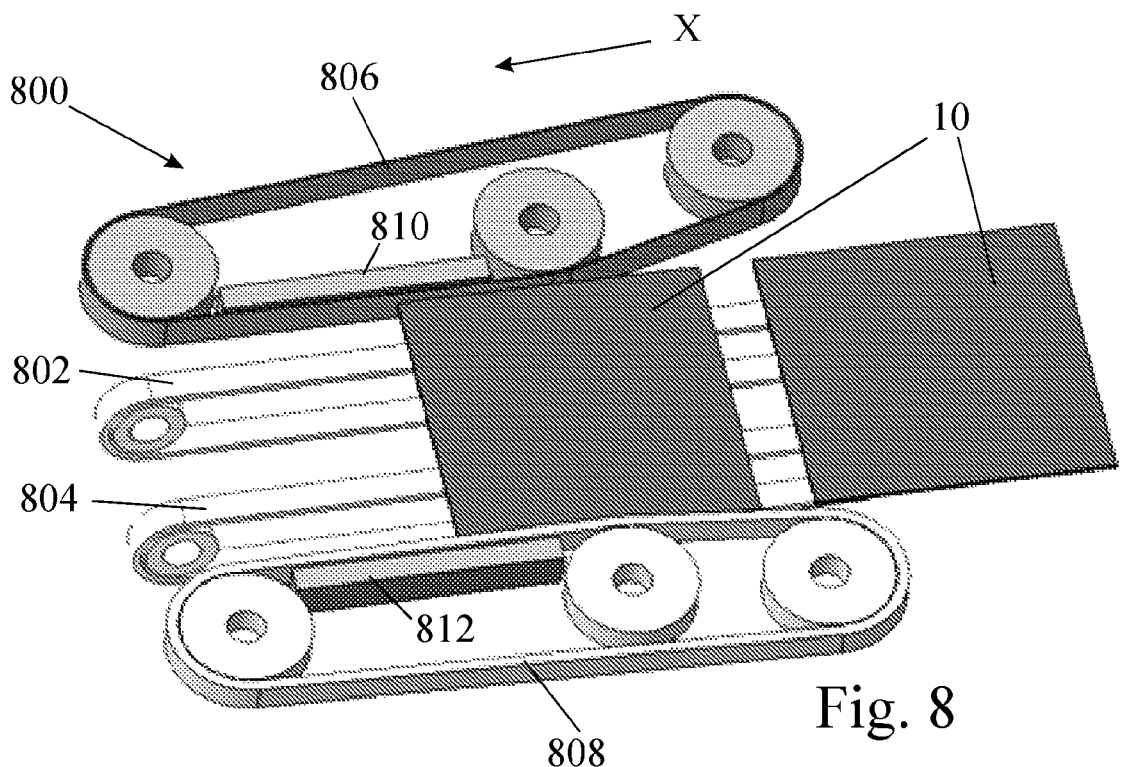
FIG. 8 is a perspective view of a transport mechanism of a third embodiment of the present disclosure.

In the embodiment of FIG. 8, the transport mechanism 800 comprises a conveyor formed of two endless belts 802, 804 on which substrates 10 rest under their own weight and are advanced in the X-direction towards two further lateral belt conveyors 806 and 808. The lateral belt conveyors 806 and 808 then serve as the abutments that grip the lateral edges of the substrates 10 to advance them towards the nip. At the intake end of the transport mechanism 800 the two lateral conveyors are further apart than the width of the substrates 10 to guide substrates towards a central position for them to pass between two guides 810, 812. The guides 810, 812 are spaced apart by a distance slightly greater than the width of the substrates 10 and the resilience of the endless belts 806, 808 compensates for tolerances in the width of the substrates 10. In this embodiment, frictional forces act on both the underside and lateral edges of the substrates 10 to advance them towards the nip. It should be mentioned in this context that because of the rigidity of certain substrates, notably semiconductor wafers, even when a straight edge of a substrate is urged against a straight guide, there will only be two points of contact at which force is transferred from one to the other.

Upon sufficient engagement of the leading edge of substrate 10 by the nip 40, a device, such as an electric linear actuator, can be used to disengage the lateral belts 806, 808 from the lateral edges of the substrate 10. Different ways for achieving this objective will be described below and are shown schematically in FIGS. 12A to 12C.

Figure 9:
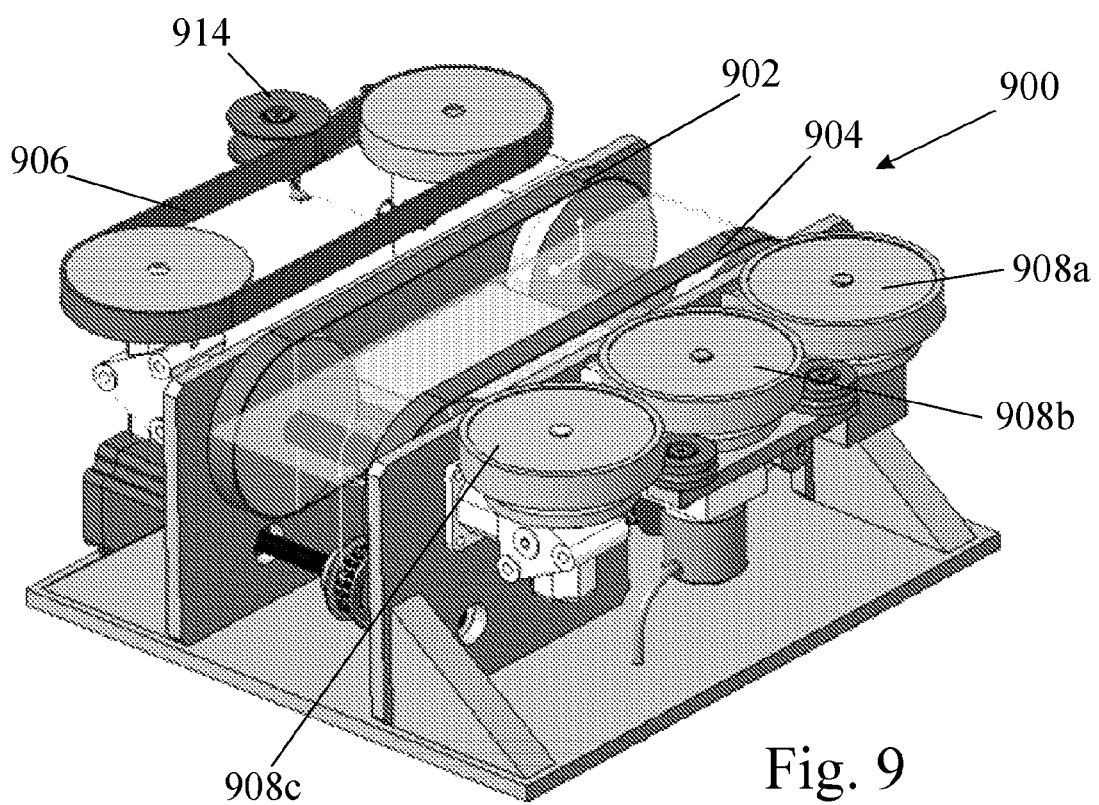
FIG. 9 is a perspective view of a transport mechanism of a fourth embodiment of the present disclosure.

The transport mechanism 900 shown in FIG. 9 comprises two endless belts 902, 904 analogous to the belts 802, 804 in FIG. 8 that are intended to support and advance the substrates towards the nip. On one side, the substrates are again advanced by a lateral edge conveyor 906 but, on the other side, three individual rollers 908a, 908b and 908c urge substrates against the lateral conveyor 906. In this embodiment, the belt conveyor 906 is tensioned by an idler roller 914 and the tensioned run serves as the reference edge to locate the substrates in the Y-direction. The rollers 908a to 908c have resilient sleeves to compensate for variations in the widths of the substrates resulting from manufacturing tolerances. As in previous cases, upon sufficient engagement of the leading edge of substrate 10 by nip 40, an electric linear actuator mechanism can separate the lateral belt 906 from the rollers 908.

Figure 10:
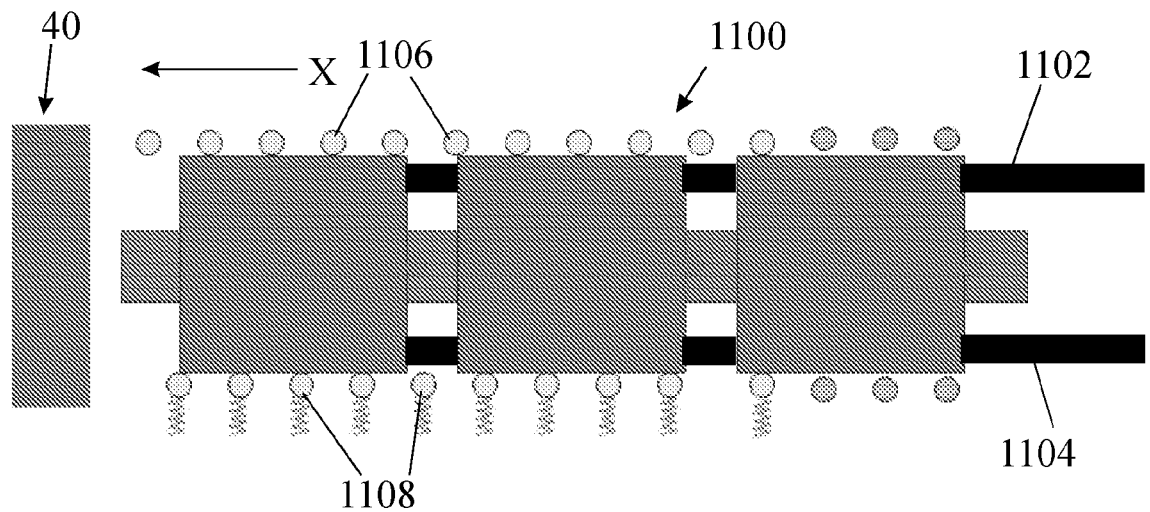
FIG. 10 is a plan view of a transport mechanism of a fifth embodiment of the present disclosure.

FIG. 10 shows an embodiment 1100 in which the transport mechanism comprises two endless belts 1102, 1104 for transporting the substrates towards a section where the lateral edges of the substrates are gripped between a series of resiliently biased rollers 1108 and opposing rollers 1106. The rollers 1106 and 1108 do not move in the X-direction but the rollers 1106 are driven to rotate clockwise, as viewed, to advance the substrates towards the nip. Similarly to the situations described with respect to transport mechanisms 600 or 700, upon sufficient engagement of the leading edge of substrate 10 by nip 40, a cam timing mechanism can separate the opposite lateral rollers 1106, 1108 which are in contact with the lateral edges of the substrate engaged in the nip, so that transport mechanism 1100 disengage from the substrate at such time point, the substrate therefore entering the nip as previously aligned and in absence of compressive forces applied by the transport mechanism.

In some embodiments, in order to align the substrate with the web in a Y-direction transverse to the direction of travel, the abutment(s) on one side of the transport mechanism are stationary in the Y-direction prior to the substrate being engaged in the nip, while an active force is applied only from the opposite side of the substrate. In such embodiments, correct alignment is achieved in the Y-direction of the edge of the substrate contacting the stationary abutment(s).

In alternative embodiments, the abutments contacting both sides of the transport mechanism may be spring biased and the spring rates (i.e., the ratio of force to change in length) may either be the same or different. If the spring rates are the same, the position of centreline of the substrates in the Y-direction will be fixed. If the spring rates differ, the spring rates can be adapted to refine the alignment of the substrate in the Y-direction prior to its leading edge entering the nip. Taking for illustration the lateral belts 806 and 808 of FIG. 8, which grip the lateral edges of the substrate to advance it towards the nip, the materials from which the belts are made, their tensioning, or any other feature affecting the spring rate can be used to adjust the position of the substrates in the Y-direction.

A side of alignment abutments of the transport mechanism being stationary in the Y-direction, even as the abutments enable advancing the substrate in the X-direction, can be referred to as the "stationary side", whereas a side including alignment abutments that can be displaced in the Y-direction (towards or away from a center line of the transport mechanism) can be referred to as the "movable side". The stationary side need not be permanently fixed with respect to the transport mechanism (e.g., at an edge) and can be positioned at any location adapted to the size of the substrate and/or the position of the pattern on the web, so as to permit transfer where intended.

As illustrated in previous embodiments and readily appreciated by a skilled person, a transport mechanism according to the present teachings can be implemented in numerous architectures including at least one movable side capable to engage one of the parallel side edges, the movable side progressively urging the other side of the substrate into contact with a side of stationary abutments or with a second side of abutments movable in the Y-direction. Regardless of the abutments being, or not, stationary in the Y-direction, they may, in some embodiments, be additionally driven to rotate around their respective axes, so as to not only grip the substrate, but also advance it in the X-direction.

If the transport mechanism includes a stationary side, the engagement or disengagement of the substrate can be achieved by displacing the movable side towards or away from the stationary side. When the transport mechanism includes two movable sides, the engagement or disengagement of the substrate can be achieved by displacing at least one of them towards or away from the other, and advantageously both towards or away from each other. Closing on the substrate, or conversely disengaging it, can be achieved by any suitable mechanism that may be controlled to shift between engagement and disengagement of the lateral edges of the substrate, such as a linear actuator, a cam mechanism, a pneumatic system, a vibrational system or any like mechanism known to the skilled person. For illustration, in some embodiments the lateral abutments or their axes of rotation can be mounted on rails traverse to the X-direction of the substrate, a motor displacing the lateral abutments towards or away from the substrate in response to the feeding of a new substrate to the transport mechanism or the engagement of the leading edge of a previously fed substrate into the nip. Disengagement takes place once the leading edge of the substrate is sufficiently gripped by the nip to proceed forward thanks to the motion induced by the at least one pressure roller of the nip. Its exact timing depends, among other things, on the speed of substrate feeding, on the dimensions of the substrate, on the width of the contact area formed by the nip and like factors readily appreciated by a skilled person. Disengagement of lateral abutments occur at a distance substantially corresponding to the length of the substrate in the feeding direction to the nip. The timing would therefore correspond to at least 95% of the length of the substrate having passed the lateral abutments closest to the nip, and in some embodiments the disengagement will be synchronous with at least 96%, at least 97%, at least 98%, or at least 99% of the length of the substrate having passed such most downstream abutments.

Figure 11:
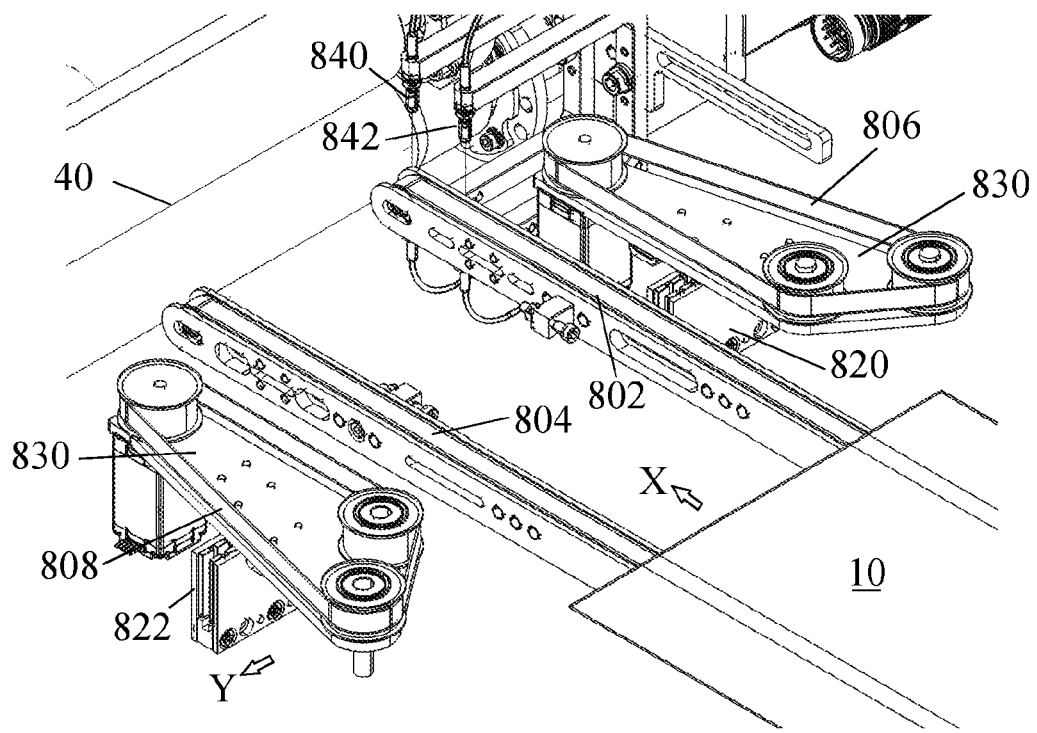
FIG. 11 is a perspective view of a transport mechanism of a sixth embodiment of the present disclosure operating on the same principles as the third and fourth embodiment but in which the lateral abutments are disengageable from the substrate when the latter enters the nip.

FIG. 11 shows one way in which the lateral abutments of FIG. 8 may be separated to disengage the abutment belts 806, 808 from the lateral edges of the substrate 10. On each side of the transport mechanism, the rollers over which the belt passes and the motor driving the belts are mounted on a platform that is slidably mounted in a channel 820, 822 and is movable in the Y-direction along the channel by means of a motor, such as a linear motor. FIG. 11 also shows sensors 840, 842 that detect when the leading edge of each substrate reaches a specified position allowing the transporting mechanism to determine or predict when the leading edge is gripped in the nip.

The different drawings of FIG. 12 schematically illustrate in top view how engagement and disengagement may take place as a substrate 10 proceeds towards a nip 40, of which only the dashed outline of one pressure cylinder 22 is visible in the figure. The virtual contact line of the nip is shown in dotted lines in each of the drawings, this being a line of contact between the pressure roller 22 and a backing surface 36 which can be a second pressure roller or a flat surface, but is not visible in the figure. The lateral abutments depicted in this figure correspond to belt conveyors 806 and 808, previously detailed with reference to transport mechanism 800 depicted in FIG. 8. For clarity, referrals to parts being herein described are shown only once on the figures.

In FIG. 12A, the disengagement of the lateral abutments is effected by movement of the guides 810, 812, their direction of movement being indicated schematically by the line 1810a and 1810b.

In FIG. 12B, the disengagement of the lateral abutments is effected by movement of the platform 830 of FIG. 11, the direction of movement being indicated schematically by the line 1816, 1826 which pass through the axes of rotation of the roller 816, 818 and 826, 828.

FIG. 12C illustrates a still further possibility that the platforms 830 of FIG. 11 may be pivotable instead of slidable, axes of the rollers of the abutment belts moving in this case along arcs designed 1818', 1826', 1818' and 1828'.

While all drawings of FIG. 12 illustrate a transport mechanism having on each side a lateral abutment being a mirror image of a similar abutment on the other side, this need not be the case. For illustration, one side may consist of a movable lateral abutment, the other being stationary, or both lateral abutments may be movable but different. For example, a transport mechanism may be constituted of a first lateral abutment being able to engage/disengage from a corresponding side of the substrate by displacement of at least a portion of the abutment along a straight line in a direction parallel to the Y-direction, the second lateral abutment on the opposite side of the transport mechanism being able to engage/disengage from a corresponding opposite side of the substrate by displacement of at least a portion of the abutment along a curved line. The differences that can exist between the lateral abutments on opposite sides of a transport mechanism (e.g., 600, 700, 800, 900 and 1100) are not restricted to their particular constructions. Their respective properties and/or effect may differ, the lateral abutments on at least one side being relatively firm, this rigidity facilitating the alignment of a substrate with higher degrees of accuracy. While illustrated in FIG. 12 with transport mechanism 800, similar principles of engagement and disengagement apply to all other transport mechanisms according to the present teachings.

If a pattern is to be applied on a single side of the substrate, the registration of the web with respect to the nip may be superfluous, as long as a proper registration of the substrate ensures proper timing of transfer, hence positioning of the pattern on one side of the substrate. Still, tension rollers along the path of the web may facilitate such alignment between the substrate and the pattern to be transferred. When patterns are to be applied on both sides from two webs, either at two subsequent nips but more typically at a same nip, then tension rollers along the path of at least one of the two webs is required to ensure proper alignment, at least of the two webs one with another. The presence of tension rollers along each of the paths of both webs may further facilitate the aligning process.

A presence sensor may be provided between the feeder and transportation conveyors, to commence movement of the transport mechanism 58 when a substrate is detected in the feeder conveyor 54. Additional sensors can be provided to assess the registration of the substrate with respect to the nip and synchronize the arrival of its leading edge with the desired positioning of a pattern to be transferred thereto from a web.

The transportation station 56 may further comprise a heater 52 which can serve to heat the substrate 10 to a desired temperature prior to its entry into the nip. In a similar manner, a heater may be positioned along the path of the web to raise its temperature prior to contacting the substrate. Alternatively, or additionally, if an adhesive coating is applied on the substrate or on a web, or on selected regions thereof, and if the adhesive used in such coating is heat activatable (optionally in addition to being pressure activatable), then a heater may be positioned downstream an applicator adapted to apply the adhesive coating.

The desired temperature at any of these locations may be one that may activate the adhesive in the composition carried by the web 14, for instance if the composition includes an adhesive which is thermally activated, and need not be the same for the substrate and each of the webs. The appropriate heating temperature will depend on the nature of the composition and the adhesive, and the materials the webs and substrates are made of and is discussed in more detail in WO 2018/020479 and U.S. Pat. No. 10,973,129. By way of illustration, the heating temperature may depend upon the softening temperature of the composition and of adhesives therein, and may therefore differ for each side of a same substrate the patterns being applied from different webs optionally comprising distinct substances and/or arrangements thereof. In embodiments where heaters are utilized, care is taken to configure any necessary apparatus and parts thereof (e.g., contacting or adjacent the heated web and/or heated substrate) to withstand the heat without distortion or failure.

The heating may take different forms depending on the temperature to be reached and can be by conduction, convection or radiation. While webs can also be heated by radiation as described in the following with respect to the substrates, they are typically heated, when desired, with hot air or by contact with heated elements (e.g., heated rollers).

In embodiments where the substrate is heated by radiation, the heater 52 may include one or more infrared lamps positioned above and/or below the transportation conveyor 58. Heating lamps positioned on both sides of the substrate 10 may be utilised together to ensure even heating and/or to reduce the length of a heating station over the path followed by the substrate. Where such heating is required, the transportation conveyor 58 may be split much like the feeding conveyor 54, i.e. it may comprise two thin synchronised belts each supporting one side of the substrate.

In some embodiments, the infrared lamps comprised in heater 52 may be configured to collectively emit radiation that is equivalent to about 6 kW, 12 KW, 24 kW or any other appropriate amount of radiation. As illustrated in FIG. 3, shields 74 may be provided to block the radiation from the lamps reaching outside the heating area. A cooling apparatus 76 may be provided to prevent overheating of the shields. The cooling apparatus may comprise air cooling components or any other means known in the art.

While heating can be performed upstream of the nip for the web(s) and/or substrate, it can alternatively or additionally be performed at the nip. For instance, the pressure roller 22 may, in some embodiments, additionally serve as a heating roller. Heating the web and/or the substrate upstream of the nip may obviate the need for any heating of the nip or it may allow for heating the nip to a lower temperature. In some embodiments, the heating may occur even prior to the transportation station 56, although the nearer to the nip 40 that the heating occurs, the more efficient the process. If performed at more than one location and/or towards more than one the substrate and one of the webs, the different heating temperatures that may be set to provide a gradual change in temperatures as the substrate and the web(s) proceed to a nip. Such gradients can be selected to avoid too rapid a rise, or conversely too rapid a drop, in temperature which may adversely affect the transfer of a pattern from a web to an intended surface of the substrate. Temperature sensors may be incorporated into the apparatus to ensure temperatures are within an acceptable range, and controllers (manual or computer controlled) provided to keep the temperatures within their respectively acceptable ranges.

As mentioned above, only one substrate 10 may, in some embodiments, be placed on the transportation conveyor 58 at any one time so that waste is minimised in the event of a shutdown. For example, if a shutdown occurs whilst a substrate 10 is part way through the heater, the substrate may be considered scrap if it has only been partially heated and then allowed to cool, or if it has been overheated due to the conveyor 58 stopping in the heating area. This may be mitigated by using a shutdown procedure where each station is shutdown sequentially as it passes a final substrate 10 on to the next station. For example, the transportation station 56 may only shutdown once the leading edge of the final substrate 10 has entered the nip 40. In a such a case, a few of the substrates salvaged from irreversible processing by this sequential shutdown need not be wasted and could be recycled.

Following passage through the nip, the web can be separated (e.g., peeled away) from the substrate, such separation, if occurring, completing the transfer of the substance pattern from a web to the substrate. The substrate and the web(s) may be cooled downstream of the nip to assist separation. As the cooling is believed to accelerate or otherwise facilitate the adherence of the substance pattern to the substrate and/or ease the release of the pattern from the flexible web, the appropriate cooling temperature and/or cooling rate will depend on the nature of the composition and of its components. Regardless of the means employed to ensure cooling of the substrates and/or webs, the site and/or device where such cooling takes place, if desired, can be referred to as a cooling station.

The separation device 30 illustrated in the exemplary embodiment of the depicted apparatus comprises a metal plate that is bent about a small radius to define an acute angle. The web on its return path to the take-up roller 32 is bent over the sharp edge defined by the outer sides of the bent metal plate. This action peels the web 14 away from the substrate 10 leaving the composition adhering to the substrate 10. A skilled person will readily appreciate that similar satisfactory peeling of the web 14 can be achieved by the angle formed between the path of web 14 and the path of substrate 10 or by alternative separation devices. Regardless of the means employed to ensure peeling of the web from the surface of the substrate, the site and/or device where such separation takes place, if desired, can be referred to as a separation or separating station. The cooling station and separation station are non-limiting examples of stations downstream of the nip where the substrates and the webs can be subjected to any desired action, these stations being also referred to as post-transfer stations.

The substrate now bearing at least part of a desired pattern on at least one of its sides can, if needed, be further treated. For instance, it may be exposed to energy in an amount sufficient to cause sintering and/or fusing of metal particles contained in the substance so as to render the transferred pattern conductive, it may be cured by radiation if the substance includes a curable material that may further adherence to the substrate. In the event that a web is not peeled away from the substrate, the treatment taking place following the nip may include separating between individual substrates that would be otherwise "linked" by way of attachment to a common web (e.g., by cutting the web in-between adjacent substrates). Such post-treatment can be performed off-line in a separate apparatus (e.g., a solar cell furnace) or in-line with an apparatus according to the present teachings. A variety of post-treatments exist depending on the substrate, the transferred pattern and the intended use, and are known to the skilled persons, hence shall not be herein detailed. The sites or devices where such post-treatment of the substrates and the webs may take place, whether still attached one to another or separated, can be referred to as post-treatment stations. Post-treatment stations can be considered another kind of post-transfer stations.

Although the present disclosure has been described with respect to various specific embodiments presented thereof for the sake of illustration only, such specifically disclosed embodiments should not be considered limiting.

It is therefore to be understood that the foregoing description including the specifically described apparatuses are merely exemplary of the presently disclosed subject matter, are presented for the sake of illustration only, and are therefore not intended to be necessarily limiting. Furthermore, all examples, embodiments, implementations, cases, instances, figures/illustrations, etc. of such features described herein should be understood to be non-limiting. Many other alternatives, modifications, alterations, permutations, and variations of such features will be apparent to those skilled in the art based upon the disclosure herein. Accordingly, it is intended to embrace all such alternatives, modifications and variations, and any change which come within their meaning and range of equivalency.

The word "exemplary" is used herein to mean "serving as an example, instance or illustration". Any example, embodiment, case, instance, or figure/illustration of a certain feature described as "exemplary" is not necessarily to be construed as preferred or advantageous over other embodiments and/or to exclude the incorporation of one or more features from other embodiments. Furthermore, a feature which is described as preferred or advantageous in some embodiments, may not necessarily be preferred or advantageous in other embodiments.

It is appreciated that certain features of the presently disclosed subject matter, which are, for clarity, described in the context of different embodiments, may also be provided in combination in the same embodiment or embodiments. Conversely, various features of the presently disclosed subject matter, which are, for brevity, described in the context of the same embodiment or embodiments, may also be provided separately or in any suitable sub-combination or as suitable in any other described embodiment of the presently disclosed subject matter. Certain features described in the context of an embodiment are not to be considered essential features of the embodiment, unless the embodiment is inoperative without those features.

Unless otherwise defined or understood from the disclosure herein, all technical and scientific terms used herein have the same meaning as commonly understood by one of ordinary skill in the art to which the present disclosure pertains.

Unless otherwise stated, the use of the expression "and/or" between the last two members of a list of options for selection indicates that a selection of one or more of the listed options is appropriate and may be made.

In the description and claims of the present disclosure, each of the verbs "comprise", "include" and "have", and conjugates thereof, are used to indicate that the object or objects of the verb are not necessarily a complete listing of features, members, steps, components, elements or parts of the subject or subjects of the verb. Nevertheless, it is contemplated that the apparatuses of the present teachings also consist essentially of, or consist of, the recited components, and that the methods of the present teachings also consist essentially of, or consist of, the recited process steps.

As used herein, the singular form "a", "an" and "the" include plural references and mean "at least one" or "one or more" unless the context clearly dictates otherwise.

As used herein, the term at least one of A and B is intended to mean either A or B, and may mean, in some embodiments, A and B.

Positional or motional terms such as "upper", "lower", "over", "under", "right", "left", "bottom", "back", "front", "below", "lowered", "low", "top", "above", "elevated", "high", "vertical", "side", "horizontal", "backward", "forward", "upstream" and "downstream", as well as grammatical variations thereof, may be used herein for exemplary purposes only, to illustrate the relative positioning, placement or displacement of certain objects (e.g., components in an apparatus), to indicate a first and a second object or to do both. Such terms do not necessarily indicate that, for example, a "bottom" object is below a "top" object, as such directions, components or both may be flipped, rotated, moved in space, placed in a diagonal orientation or position, placed horizontally or vertically, or similarly modified.

Unless otherwise stated, when the outer bounds of a range with respect to a feature of an embodiment of the present disclosure are noted herein, it should be understood that in the embodiment, the possible values of the feature may include the noted outer bounds as well as values in between the noted outer bounds. Herein, unless otherwise stated, adjectives such as "substantially", "approximately" and "about" that modify a condition or relationship characteristic of a feature or features of an embodiment of the presently disclosed subject matter, are to be understood to mean that the condition or characteristic is defined to within tolerances that are acceptable for operation of the embodiment for an application for which it is intended, or within variations expected from the measurement being performed and/or from the measuring instrument being used. For example, when the term "about" and "approximately" precedes a numerical value, it may indicate +/−15%, or +/−10%, or even only +/−5%, or any other suitable +/−variation within such ranges, and in some instances may indicate the precise value. Furthermore, unless otherwise stated, the terms (e.g., numbers) used in an embodiment of the presently disclosed subject matter, even without such adjectives, should be construed as having tolerances which may depart from the precise meaning of the relevant term but would enable the embodiment or a relevant portion thereof to operate and function as described, and/or as understood by a person skilled in the art.

To the extent necessary to understand or complete the disclosure of the present disclosure, all publications, patents, and patent applications mentioned herein, including in particular the applications of the Applicant, are expressly incorporated by reference in their entirety as is fully set forth herein.

The invention claimed is:

1. A system for transferring a substance pattern to a substrate, the system comprising a web carrying the substance pattern, a web drive mechanism for driving the web through a nip between a roller and an opposing surface, and a transport mechanism for advancing in an X-direction a substrate having parallel side edges towards the nip, for the substrate to be gripped in the nip and frictionally driven through the nip at the same time as, and with the same speed as, the web, the web being pressed against a surface of the substrate during passage through the nip to cause the substance pattern to transfer from the web to the substrate; wherein the transport mechanism comprises;
   a) lateral abutments located on opposite sides of the transport mechanism and movable relative to one another in a Y-direction traverse to the X-direction and resiliently biased towards one another to grip opposite side edges of the substrate, the lateral abutments serving to align the substrate with the web and to apply a force to advance the substrate towards the nip; and
   b) a release mechanism disposed and configured to disengage the lateral abutments from the opposite side edges of the substrate upon detected or predicted engagement of a leading edge of the substrate into the nip.

2. A system as claimed in claim 1, wherein the transport mechanism further comprises an endless conveyor for supporting the underside of the substrates driven at substantially the same speed as the web, the lateral abutments being coupled for movement with the conveyor.

3. A system as claimed in claim 1, wherein the lateral abutments are belts or rollers rotatable about axes that are at a predetermined distance from the nip, at least one of the belts or rollers being drivable to advance the substrate towards the nip.

4. A system as claimed in claim 3, wherein the lateral abutments comprise two opposed belts rotatable about vertical axes, both belts being drivable to advance the substrate towards the nip at the same speed as the web.

5. A system as claimed in claim 1, further comprising a sensor disposed to determine the position of the leading edge of each substrate, to ensure arrival of the leading edge of each substrate at the nip at the correct time to align with a pattern on the web.

6. A system as claimed in claim 1, wherein the opposing surface of the nip is stationary.

7. A system as claimed in claim 1, wherein the roller is a first pressure roller and the opposing surface is formed by a second pressure roller, two webs passing through the nip at the same time with the substrate, the two webs being constituted of a first web carrying a first substance pattern and a second web carrying a second substance pattern, the first and second substance patterns being transferred to opposite sides of the substrate.

8. A system as claimed in claim 7, further comprising at least one tension roller along a path of at least one of the two webs, the at least one tension roller being movable to ensure correct registration of the at least one web with respect to the other of the two webs.

9. A system as claimed in claim 1, wherein a feed conveyor is provided to feed substrates individually to the transport mechanism so that the lateral abutments engage the parallel side edges of one substrate at a time.

10. A system as claimed in claim 9, wherein the feed conveyor transports the substrates in a plane different than that of the transport mechanism, the system further comprising a lifting mechanism disposed to lift up or down substrates individually from the feed conveyor to the transport mechanism.

11. A system as claimed in claim 1, further comprising a heater for heating each substrate advanced by the transport mechanism and/or the web(s) driven by the web drive mechanism(s) prior to reaching the nip.

12. A system as claimed in claim 1, further comprising an applicator for applying an adhesive to at least one of the substrate and the web(s) prior to reaching the nip or prior to passage through a heater.

13. A system as claimed in claim 1, further comprising at least one post-transfer station downstream of the nip, the at least one post-transfer station being selected from a group consisting of (i) a cooling station adapted to decrease a temperature of the substrates and/or web(s), (ii) a separating station adapted to separate the web from a surface of the substrate, and (iii) a treatment station adapted to modify the substance patterns and/or their adherence to the substrates.

14. A system as claimed in claim 13, wherein the substance pattern(s) include particles of electrically conductive material and the system further comprises a treatment station adapted to sinter the particles, so as to render the pattern(s) electrically conductive.

15. A system as claimed in claim 1, wherein the lateral abutments are located on opposite first and second sides of the transport mechanism, the abutment(s) on the first side of the transport mechanism being stationary in a Y-direction, transverse to the X-direction, and the abutment(s) on the second side being resiliently biased towards the abutment(s) on the first side.

16. A system as claimed in claim 1, wherein the lateral abutments located on opposite sides of the transport mechanism are movable in the Y-direction to align the substrate with the web so that at the nip a deviation between a desired position of the pattern, or a point therein, on the substrate and an actual position of the pattern, or the point therein, on the substrate is ±100 micrometre (µm) or less, ±75 µm or less, ±50 µm or less, ±20 µm or less, or ±10 µm or less, said deviation being in at least one of the X-direction and Y-direction.

17. A method of introducing a substrate having parallel opposite side edges into a nip defined between a pressure roller and an opposing surface through which the substrate is driven, in which method the substrate is advanced towards the nip in an X-direction by a transport mechanism having lateral abutments resiliently biased towards one another and gripping the opposite side edges of the substrate, the substrate being advanced towards the nip by a force applied by the lateral abutments and being released from engagement therewith upon detected or predicted engagement of a leading edge of the substrate into the nip.

18. A method as claimed in claim 17, wherein the lateral abutments are located on opposite first and second sides of the transport mechanism, the abutment(s) on the first side of the transport mechanism being stationary in a Y-direction, transverse to the X-direction, and the abutment(s) on the second side being resiliently biased towards the abutment(s) on the first side.

19. A method as claimed in claim 17, further comprising driving a web carrying a substance pattern through the nip at the same time as, and with the same speed as, the substrate, the web being pressed against a surface of the substrate during passage through the nip to cause the substance pattern to transfer from the web to the substrate.

20. A method as claimed in claim 19, wherein the lateral abutments align the substrate with the substance pattern prior to entering the nip, the alignment being in a Y-direction traverse to the X-direction.

* * * * *